United States Patent
Pan et al.

(10) Patent No.: US 11,991,862 B2
(45) Date of Patent: May 21, 2024

(54) HEAT SINK WITH COUNTER FLOW DIVERGING MICROCHANNELS

(71) Applicant: City University of Hong Kong, Hong Kong (HK)

(72) Inventors: Chin Pan, Hong Kong (HK); Xingchi Jiang, Hong Kong (HK); Shiwei Zhang, Guangzhou (CN)

(73) Assignee: City University of Hong Kong, Hong Kong (HK)

( * ) Notice: Subject to any disclaimer, the term of this patent is extended or adjusted under 35 U.S.C. 154(b) by 105 days.

(21) Appl. No.: 17/474,074

(22) Filed: Sep. 14, 2021

(65) Prior Publication Data
US 2022/0087053 A1     Mar. 17, 2022

Related U.S. Application Data

(60) Provisional application No. 63/077,849, filed on Sep. 14, 2020.

(51) Int. Cl.
*H05K 7/20*     (2006.01)
*F28F 3/12*     (2006.01)

(52) U.S. Cl.
CPC ............. *H05K 7/2039* (2013.01); *F28F 3/12* (2013.01); *H05K 7/20327* (2013.01)

(58) Field of Classification Search
CPC ..... H05K 7/2039; H05K 7/20327; F28F 3/12; F28F 13/187; F28F 1/022; F28F 2260/02
See application file for complete search history.

(56) References Cited

U.S. PATENT DOCUMENTS

| | | | | |
|---|---|---|---|---|
| 5,453,641 A | * | 9/1995 | Mundinger | ............... F28D 9/00 361/689 |
| 5,845,702 A | * | 12/1998 | Dinh | ..................... F24F 3/1405 165/104.21 |

(Continued)

OTHER PUBLICATIONS

P. C. Lee, C. Pan, Boiling heat transfer and two-phase flow of water in a single shallow microchannel with a uniform or diverging cross section, Journal of Micromechanics and Microengineering 18 (2008).

(Continued)

*Primary Examiner* — Raheena R Malik
(74) *Attorney, Agent, or Firm* — Idea Intellectual Limited; Margaret A. Burke; Sam T. Yip

(57) ABSTRACT

The present invention provides a microchannel heat sink with plural microchannels, each having a respective inlet and outlet to permit flow, in particular two-phase flow, of a working fluid. The plural microchannels are arranged such that adjacent microchannels accommodate flow of working fluid in opposite directions and are thermally coupled to each other to enable heat exchange between the corresponding adjacent microchannels. In one aspect, a microchannel inlet is positioned at an angle (e.g., 90 degrees) with respect to its outlet. The plural microchannels define parallel longitudinal axes that are optionally arranged on the same plane and/or side-by-side in a single layer. Further, in one aspect, each microchannel cross-sectional area increases as the channel length progresses from an upstream end (e.g., adjacent to the inlet) to a downstream end (e.g., adjacent to the outlet) of the corresponding microchannel.

16 Claims, 16 Drawing Sheets

(56) References Cited

U.S. PATENT DOCUMENTS

| | | | | |
|---|---|---|---|---|
| 6,672,373 | B2* | 1/2004 | Smyrnov | F28D 15/0266 174/15.2 |
| 6,729,389 | B2* | 5/2004 | Ohashi | F28D 1/0383 257/E23.098 |
| 7,992,625 | B1* | 8/2011 | Spokoiny | F28F 3/12 165/80.4 |
| 8,919,426 | B2* | 12/2014 | Hardesty | F28D 15/0233 165/104.21 |
| 11,611,192 | B2* | 3/2023 | Amalfi | H01S 3/1062 |
| 2010/0032150 | A1* | 2/2010 | Determan | F28D 15/0266 165/185 |
| 2010/0326627 | A1* | 12/2010 | Schon | H05K 7/20309 165/173 |
| 2012/0087088 | A1* | 4/2012 | Killion | F28F 3/12 165/104.25 |
| 2013/0027883 | A1* | 1/2013 | Campbell | H05K 7/20318 165/185 |
| 2013/0027884 | A1* | 1/2013 | Campbell | H05K 7/20818 165/104.21 |
| 2014/0196498 | A1* | 7/2014 | Xiao | H01L 23/473 62/524 |
| 2017/0135247 | A1* | 5/2017 | Ogata | F28D 15/025 |
| 2017/0299239 | A1* | 10/2017 | Steven | F28F 9/0224 |
| 2018/0158756 | A1* | 6/2018 | Smoot | H01L 23/427 |
| 2018/0299206 | A1* | 10/2018 | Kim | F28D 15/025 |
| 2022/0087053 | A1* | 3/2022 | Pan | H05K 7/2039 |
| 2022/0136780 | A1* | 5/2022 | Steven | F24S 10/95 136/259 |
| 2022/0412664 | A1* | 12/2022 | Chiriac | F28D 15/0233 |

OTHER PUBLICATIONS

CT Lu, C Pan, Stabilization of flow boiling in microchannel heat sinks with a diverging cross-section design, Journal of Micromechanics and microengineering, 18 (2008).

C.T. Lu, C. Pan, Convective boiling in a parallel microchannel heat sink with a diverging cross section and artificial nucleation sites, Experimental Thermal and Fluid Science, vol. 35, No. 5, pp. 810-815, 2011.

W. Kuo, C. Pan. A Reliability Look at Energy Development. Joule. 2 (2018) 5-9.

The Climate Group, Market Transformation of low carbon Technology: Electric Vehicles-Executive Summary; 2010.

Y.-F. Wang, J.-T. Wu. Thermal performance predictions for an HFE-7000 direct flow boiling cooled battery thermal management system for electric vehicles. Energy Conversion and Management. 207 (2020).

K. Gould, S.Q. Cai, C. Neft, A. Bhunia. Liquid Jet Impingement Cooling of a Silicon Carbide Power Conversion Module for Vehicle Applications. IEEE Transactions on Power Electronics. 30 (2015) 2975-2984.

P. Wang, P. McCluskey, A. Bar-Cohen. Two-Phase Liquid Cooling for Thermal Management of IGBT Power Electronic Module. Journal of Electronic Packaging. 135 (2013).

S.G. Kandlikar. Review and Projections of Integrated Cooling Systems for Three-Dimensional Integrated Circuits. Journal of Electronic Packaging. 136 (2014).

A. Bar-Cohen, P. Wang. Thermal management of high heat flux nanoelectronic chips. Microgravity Science and Technology. 19 (2007) 48-52.

J.B. Campbell, L.M. Tolbert, C.W. Ayers, B. Ozpineci, K.T. Lowe. Two-Phase Cooling Method Using the R134a Refrigerant to Cool Power Electronic Devices. IEEE Transactions on Industry Applications. 43 (2007) 141-147.

D.B. Tuckerman, R.F.W. Pease. High-performance heat sinking for VLSI. IEEE Electron device letters. 2 (1981) 126-129.

J.R. Thome. Boiling in microchannels: a review of experiment and theory. International Journal of Heat and Fluid Flow. 25 (2004) 128-139.

S.G. Kandlikar. Heat Transfer Mechanisms During Flow Boiling in Microchannels. Journal of Heat Transfer. 126 (2004) 8-16.

Kennedy J E, Dowling M F, et al., The onset of flow instability in uniformly heated horizontal microchannels. J Heat Transfer. 122 (2000) 118-125.

D. Attinger, C. Frankiewicz, A.R. Betz, T.M. Schutzius, R. Ganguly, A. Das, et al. Surface engineering for phase change heat transfer: A review. MRS Energy & Sustainability. 1 (2014).

S. Bigham, S. Moghaddam. Role of bubble growth dynamics on microscale heat transfer events in microchannel flow boiling process. Applied Physics Letters. 107 (2015).

C.T. Lu, C. Pan. A highly stable microchannel heat sink for convective boiling. Journal of Micromechanics and Microengineering. 19 (2009).

D. Deng, W. Wan, Y. Tang, Z. Wan, D. Liang. Experimental investigations on flow boiling performance of reentrant and rectangular microchannels—A comparative study. International Journal of Heat and Mass Transfer. 82 (2015) 435-446.

Y. Sun, L. Zhang, H. Xu, X. Zhong. Subcooled flow boiling heat transfer from microporous surfaces in a small channel. International Journal of Thermal Sciences. 50 (2011) 881-889.

P. Bai, T. Tang, B. Tang. Enhanced flow boiling in parallel microchannels with metallic porous coating. Applied Thermal Engineering. 58 (2013) 291-297.

D. Li, G.S. Wu, W. Wang, Y.D. Wang, D. Liu, D.C. Zhang, et al. Enhancing flow boiling heat transfer in microchannels for thermal management with monolithically-integrated silicon nanowires. Nano Lett. 12 (2012) 3385-3390.

S.B. White, A.J. Shih, K.P. Pipe. Boiling surface enhancement by electrophoretic deposition of particles from a nanofluid. International Journal of Heat and Mass Transfer. 54 (2011) 4370-4375.

J.J. Lee, D.Y. Liu, S.-c. Yao. Flow instability of evaporative micro-channels. International Journal of Heat and Mass Transfer. 53 (2010) 1740-1749.

K. Balasubramanian, P.S. Lee, L.W. Jin, S.K. Chou, C.J. Teo, S. Gao. Experimental investigations of flow boiling heat transfer and pressure drop in straight and expanding microchannels—A comparative study. International Journal of Thermal Sciences. 50 (2011) 2413-2421.

K. Balasubramanian, P.S. Lee, C.J. Teo, S.K. Chou. Flow boiling heat transfer and pressure drop in stepped fin microchannels. International Journal of Heat and Mass Transfer. 67 (2013) 234-252.

V.S. Duryodhan, A. Singh, S.G. Singh, A. Agrawal. Convective heat transfer in diverging and converging microchannels. International Journal of Heat and Mass Transfer. 80 (2015) 424-438.

Y.K. Prajapati, M. Pathak, M. Kaleem Khan. A comparative study of flow boiling heat transfer in three different configurations of microchannels. International Journal of Heat and Mass Transfer. 85 (2015) 711-722.

A. Mukherjee, S.G. Kandlikar. The effect of inlet constriction on bubble growth during flow boiling in microchannels. International Journal of Heat and Mass Transfer. 52 (2009) 5204-5212.

A. Koşar, C.-J. Kuo, Y. Peles. Suppression of Boiling Flow Oscillations in Parallel Microchannels by Inlet Restrictors. Journal of Heat Transfer. 128 (2006) 251-260.

G. Wang, P. Cheng, A.E. Bergles. Effects of inlet/outlet configurations on flow boiling instability in parallel microchannels. International Journal of Heat and Mass Transfer. 51 (2008) 2267-2281.

S. Szczukiewicz, N. Borhani, J.R. Thome. Two-phase heat transfer and high-speed visualization of refrigerant flows in 100×100 μ m2 silicon multi-microchannels. International Journal of Refrigeration. 36 (2013) 402-413.

C. Fang, M. David, A. Rogacs, K. Goodson. Volume of Fluid Simulation of Boiling Two-Phase Flow in a Vapor-Venting Microchannel. Frontiers in Heat and Mass Transfer. 1 (2010).

M.P. David, J. Miler, J.E. Steinbrenner, Y. Yang, M. Touzelbaev, K.E. Goodson. Hydraulic and thermal characteristics of a vapor venting two-phase microchannel heat exchanger. International Journal of Heat and Mass Transfer. 54 (2011) 5504-5516.

S. Zhang, W. Yuan, Y. Tang, J. Chen, Z. Li. Enhanced flow boiling in an interconnected microchannel net at different Inlet subcooling. Applied Thermal Engineering. 104 (2016) 659-667.

S. Zhang, Y. Tang, W. Yuan, J. Zeng, Y. Xie. A comparative study of flow boiling performance in the interconnected microchannel net

(56) References Cited

OTHER PUBLICATIONS and rectangular microchannels. International Journal of Heat and Mass Transfer. 98 (2016) 814-823.

S. Zhang, Y. Sun, W. Yuan, Y. Tang, H. Tang, K. Tang. Effects of heat flux, mass flux and channel width on flow boiling performance of porous interconnected microchannel nets. Experimental Thermal and Fluid Science. 90 (2018) 310-318.

W. Li, X. Qu, T. Alam, F. Yang, W. Chang, J. Khan, et al. Enhanced flow boiling in microchannels through integrating multiple micro-nozzles and reentry microcavities. Applied Physics Letters. 110 (2017).

S.J. Kline, F.A. McClintock, Describing uncertainties in single-sample experiments, Mech. Eng.75 (1953) 3-8.

* cited by examiner (a-2) ($T_w$-$T_{sat}$=10.8°C)    (b-2) ($T_w$-$T_{sat}$=9.3°C)

(a-3) ($T_w$-$T_{sat}$=18.8°C)    (b-3) ($T_w$-$T_{sat}$=16.9°C)

(a) Low heat flux (b) Median heat flux (c) High heat flux

FIG. 11A      FIG. 11B

HEAT SINK WITH COUNTER FLOW DIVERGING MICROCHANNELS

FIELD OF THE INVENTION

The present invention relates to a heat sink, and, more particularly, to a microchannel-based heat sink including counter-flow diverging microchannels. The invention further includes a cooling system that includes the heat sink as well as a device to be cooled.

BACKGROUND

Enhancing energy efficiency and reducing $CO_2$ emissions are critical for sustainable development. High-capacity energy storage is crucial to further broaden the use of intermittent renewable energy, such as wind and solar power. Batteries in electric vehicles are an important source of energy storage [1]. Moreover, due to high energy efficiency, broadening the use of electric vehicles presents a great opportunity to lower global $CO_2$ emissions. Indeed, the energy efficiency of electric vehicles is 46% higher than that of internal combustion engines and the use of electric vehicles has the great potential to reduce $CO_2$ emission by 13-68% [2].

One of the technology challenges for the further development of electric vehicles is the thermal management system, including battery thermal management [3] and power electronic inverter module thermal management [4]. Particularly, the heat flux of the Insulated Gate Bipolar Transistors (IGBT) [5] devices for the next-generation hybrid electric vehicles could reach 5 $MW \cdot m^{-2}$ as the current capacity and switching frequency increases, while the chip temperature must be maintained below 125° C. [6]. Moreover, the heat transfer area for such devices may be relatively large, on the order of 10 $cm^2$ [5].

In addition to power electronics, the miniaturization of integrated circuits [6-8], further intensifies heat dissipation requirements by requiring an even lower operating temperature of 85° C. Such high demands in heat dissipation rates from relatively large heat transfer areas with a relatively low operating temperature limits requires two-phase flow cooling using a suitable coolant. In particular, convective boiling in a heat sink with microchannel arrays is a very promising solution for such high heat transfer performance, as microchannel arrays may provide a greater heat transfer area for a given base area and potentially may have a high heat transfer coefficient (HTC).

Since the pioneering work on microchannel heat sink of Tuckerman and Pease [9], which provided a large contact surface area for liquid flow and exhibited high-density heat transfer capacity, numerous researchers have been dedicated to the study of flow boiling heat transfer in microchannels. Indeed, with multiple flow passages in small hydraulic diameter and utilizing latent heat through the liquid-vapor phase change, flow boiling in microchannels has become one of the most attractive approaches for cooling high-power electronics. However, there are still many obstacles preventing its practical application. These include the large wall superheat for the onset of nucleate boiling (ONB) [10], the relatively low critical heat flux (CHF) caused by premature dry-out [11], and poor temperature uniformity along the microchannels.

Convective boiling in microchannels also suffers two-phase flow instability under certain conditions [12]. The bubbles generated in the channels may expand both forward and backward, thus the latent heat carried by the bubbles may not be quickly transported out of the channel and deteriorate the heat transfer performance. Large temperature and pressure fluctuations may result in possible coolant leakage with catastrophic failure of the entire system. Existing relevant technology/products of flow boiling in microchannels mainly encounter several inherent flaws of two-phase flow heat transfer, such as low critical heat flux, temperature non-uniformity distribution (especially for large heating areas), high pressure drops for circulation, and severe flow instability under high heat flux conditions.

In order to meet these challenges and enhance heat transfer capability, extensive studies of flow boiling in microchannels have been conducted both theoretically and experimentally. Modifying the microchannel surface characteristics is a common and effective method to enhance bubble nucleation and boiling heat transfer in microchannels. Usually, the modification of the surface properties [13] can bring about a significant increase in heat transfer capacity, due to the additional surface area or porous structure providing a large number of nucleation sites.

Bigham and Moghaddam [14] conducted flow boiling experiments and presented the role of bubble growth dynamics on microscale heat transfer. The results showed that bubble nucleation brought significant cooling and periodic reduction of hot surface temperatures. Therefore, more nucleation sites result in a sharp increase of boiling bubbles, acceleration of bubble frequency, and a significant increment in the heat transfer rate. Thus, many researchers have proposed techniques for creating surface nucleation sites through etching, microscale coating or inclusion of nanowires to enhance nucleate boiling heat transfer in microchannels. For example, Lu and Pan [15] introduced artificial cavities on surface by laser drilling to study flow boiling in diverging microchannels. Three kinds of cavity distributions included smooth surfaces (no cavities), cavities distributed in the downstream half channel and those distributed along whole channel. Their experimental results indicated that the surface with artificial cavities stabilized the two-phase flow and demonstrated a wider stable region in the stability map. Deng et al. [16] applied unique Ω-shaped reentrant cavities in microchannels along the flow direction. They comprehensively evaluated the heat transfer performance of ethanol and deionized water flow boiling under different inlet sub-coolings (10° C. and 40° C.) and various mass fluxes (200~300 $kg \cdot m^{-2} \cdot s^{-1}$). Their results demonstrated that porous microchannels achieved better heat transfer performance for both water and ethanol. With more uniform liquid film distribution, up to 70% elevation of HTC was achieved by the surface modification. Additionally, reentrant microchannels showed a notably lower pressure drop penalty and better two-phase instability than plain microchannels.

Copper sintering is another prominent method for making porous surfaces in microchannels. For example, adopting a solid-state sintering method, Sun et al. [17] and Bai et al. [18] investigated the boiling heat transfer enhancement in microchannels. Their results revealed that surfaces with sintered copper particles achieve better boiling heat transfer performance, lower superheat for ONB, and large enhancement of HTC than those microchannels with unmodified surfaces. Li et al. [19] explored flow boiling through the integration of nanowires in silicon-based microchannel heat sinks. Compared to unmodified surfaces, their results demonstrated better boiling heat transfer performance including delaying onset of flow oscillation, suppressing oscillating amplitude of temperature and pressure drop, and an augmented HTC. These improvements were attributed to abundant nucleation sites and to a super-hydrophilic surface property. By employing electrophoretic deposition of nanoparticles on a surface, White et al. [20] demonstrated improvement of flow boiling, augment the HTC up to 200% with their coated microchannels compared to uncoated microchannels. The review above indicates that an effective surface treatment to promote bubble nucleation may bring great improvement in heat transfer performance.

However, the heat transfer enhancement due to surface modification may degrade or eventually deteriorate due to the inevitable contamination or delamination of surface structures in long term use. In order to ensure sustainable boiling enhancement, and also stabilize the boiling two-phase flow, different flow channel designs have been proposed and investigated in the literature, including diverging microchannels, inlet restriction, vapor venting, etc.

Lee and Pan [21] and Lu and Pan [15, 22] first proposed and experimentally investigated convective boiling in diverging microchannels. They investigated flow boiling in uniform microchannels with small diverging angles. Their results demonstrated that two-phase flow in diverging microchannels can be significantly stabilized with a much-enlarged region for stable operation and higher heat transfer rate in the diverging channels compared to uniform (non-diverging) microchannels. Lee et al. [23] established a generalized instability model of evaporative microchannels combining inlet orifices and expanding microchannels, and proved that this combination can be applied along with a quantitative design to prevent the channel instability. Balasubramanian et al. [24] conducted a comparative study on the boiling performance among diverging microchannels and uniform cross-section microchannels. Their results confirmed that compared to uniform cross-section microchannels, diverging microchannels are more effective to dissipate higher heat flux with lower pressure drop and perform less instability of two-phase flow. Later, Balasubramanian et al. [25] implemented flow boiling in a new diverging microchannel configuration, i.e., stepped fin microchannels, where no flow reversals were observed. A stable flow boiling enhances heat transfer performance, which confirmed Lee and Pan's [21] conclusion. Duryodhan et al. [26] performed experimental and three-dimensional numerical studies on single-phase liquid flow in diverging and converging microchannels; the studies demonstrate that less pumping work was required as compared to uniform cross-section microchannels. Recently, Prajapati et al. [27] compared the flow boiling characteristics of deionized water in microchannels of uniform cross-section, diverging cross-section and segmented finned microchannels. The performance of diverging microchannels and segmented finned microchannels are both better than the uniform cross-section channels. Bubble clogging and flow reversal problems were partially avoided in diverging channels whereas segmented finned channels completely prevented these problems at higher heat flux. This study implies that optimization of diverging microchannels is still very much desired.

Though it may significantly increase the pressure drop, inlet flow restriction has also been proposed and employed to stabilize the boiling two-phase flow in microchannels [28]. For example, Kosar et al. [29] set inlet orifices in microchannels and conducted a series of contrast tests; the friction factors for both microchannels and inlet restrictors were obtained and compared. The results confirmed the effect of suppressing flow boiling instabilities by introducing inlet orifices. Wang et al. [30] and Szczukiewicz et al. [31] also reported the suppression of temperature and pressure fluctuations by employing an inlet constrictor in the microchannels. The installation of a throttling valve can reduce the reverse flow and improve flow uniformity.

Vapor venting, by creating effective separation of gas-liquid two-phase fluid, is an innovative way to promote heat transfer capacity, alleviate the high pressure drop penalty, and enhance flow stability in conventional microchannels. For example, C. Fang et al. [32] presented a 3D numerical simulation of the vapor-venting process in a rectangular microchannel bounded by a hydrophobic porous membrane for phase separation on one side. Their results demonstrated that the vapor-venting mechanism can significantly mitigate the vapor accumulation issue, reduce the pressure drop, and suppress the local dry-out phenomenon. Later, David et al. [33] designed a model and experimentally characterized a two-phase vapor venting parallel microchannels heat sink capped with a 220 nm pore hydrophobic PTFE membrane, which can vent the vapor phase into separate vapor transport channels. Under the same operating conditions, their results demonstrated a 60% decrease in the maximum pressure drop and higher HTC resulting in up to 4.4° C. reduction of the average substrate temperature.

Combination of flow channel design and surface structure may also significantly enhance the boiling heat transfer performance in microchannels. For example, interconnected microchannels fabricated using solid copper substrates or sintered porous copper powders associated with the advantages of reentrant cavities showed promising enhancements of flow boiling heat transfer and pressure drop reduction [34-36]. Li et al. [37] introduced a microchannel configuration by combining artificial reentrant cavities on the sidewalls with multiple microscale nozzles connected to auxiliary channels. They reported a remarkable enhancement in heat transfer performance, up to 10160 kW·m$^{-2}$ in CHF while reducing 50% mass velocity. The uniformly distributed reentry cavities along the microchannels provided sustainable thin liquid film due to the capillarity and mitigated the incipience of dry-out phenomenon. However, the microchannel area in their study was quite small, i.e., 10 mm in length and 2 mm in width.

There remains a need in the art for improved microchannel-based heat sinks that can efficiently provide cooling over a large area with high heat transfer performance.

REFERENCES

[1] W. Kuo, C. Pan. A Reliability Look at Energy Development. Joule. 2 (2018) 5-9.
[2] The Climate Group, Market Transformation of low carbon Technology: Electric Vehicles-Executive Summary; 2010.
[3] Y. F. Wang, J. T. Wu. Thermal performance predictions for an HFE-7000 direct flow boiling cooled battery thermal management system for electric vehicles. Energy Conversion and Management. 207 (2020).
[4] K. Gould, S. Q. Cai, C. Neft, A. Bhunia. Liquid Jet Impingement Cooling of a Silicon Carbide Power Conversion Module for Vehicle Applications. IEEE Transactions on Power Electronics. 30 (2015) 2975-84.
[5] P. Wang, P. McCluskey, A. Bar-Cohen. Two-Phase Liquid Cooling for Thermal Management of IGBT Power Electronic Module. Journal of Electronic Packaging. 135 (2013).
[6] S. G. Kandlikar. Review and Projections of Integrated Cooling Systems for Three-Dimensional Integrated Circuits. Journal of Electronic Packaging. 136 (2014).

[7] A. Bar-Cohen, P. Wang. Thermal management of high heat flux nanoelectronic chips. Microgravity Science and Technology. 19 (2007) 48-52.

[8] J. B. Campbell, L. M. Tolbert, C. W. Ayers, B. Ozpineci, K. T. Lowe. Two-Phase Cooling Method Using the R134a Refrigerant to Cool Power Electronic Devices. IEEE Transactions on Industry Applications. 43 (2007) 648-56.

[9] D. B. Tuckerman, R. F. W. Pease. High-performance heat sinking for VLSI. IEEE Electron device letters. 2 (1981) 126-9.

[10] J. R. Thome. Boiling in microchannels: a review of experiment and theory. International Journal of Heat and Fluid Flow. 25 (2004) 128-39.

[11] S. G. Kandlikar. Heat Transfer Mechanisms. During Flow Boiling in Microchannels. Journal of Heat Transfer. 126 (2004) 8-16.

[12] Kennedy J E, Dowling M F, et al. The onset of flow instability in uniformly heated horizontal microchannels. J Heat Transfer. 122 (2000) 118-25.

[13] D. Attinger, C. Frankiewicz, A. R. Betz, T. M. Schutzius, R. Ganguly, A. Das, et al. Surface engineering for phase change heat transfer: A review. MRS Energy & Sustainability. 1 (2014).

[14] S. Bigham, S. Moghaddam. Role of bubble growth dynamics on microscale heat transfer events in microchannel flow boiling process. Applied Physics Letters. 107 (2015).

[15] C. T. Lu, C. Pan. A highly stable microchannel heat sink for convective boiling. Journal of Micromechanics and Microengineering. 19 (2009).

[16] D. Deng, W. Wan, Y. Tang, Z. Wan, D. Liang. Experimental investigations on flow boiling performance of reentrant and rectangular microchannels—A comparative study. International Journal of Heat and Mass Transfer. 82 (2015) 435-46.

[17] Y. Sun, L. Zhang, H. Xu, X. Zhong. Subcooled flow boiling heat transfer from microporous surfaces in a small channel. International Journal of Thermal Sciences. 50 (2011) 881-9.

[18] P. Bai, T. Tang, B. Tang. Enhanced flow boiling in parallel microchannels with metallic porous coating. Applied Thermal Engineering. 58 (2013) 291-7.

[19] D. Li, G. S. Wu, W. Wang, Y. D. Wang, D. Liu, D. C. Zhang, et al. Enhancing flow boiling heat transfer in microchannels for thermal management with monolithically integrated silicon nanowires. Nano Lett. 12 (2012) 3385-90.

[20] S. B. White, A. J. Shih, K. P. Pipe. Boiling surface enhancement by electrophoretic deposition of particles from a nanofluid. International Journal of Heat and Mass Transfer. 54 (2011) 4370-5.

[21] P. C. Lee, C. Pan. Boiling heat transfer and two-phase flow of water in a single shallow microchannel with a uniform or diverging cross section. Journal of Micromechanics and Microengineering. 18 (2008).

[22] C. T. Lu, C. Pan. Stabilization of flow boiling in microchannel heat sinks with a diverging cross-section design. Journal of Micromechanics and Microengineering. 18 (2008).

[23] H. J. Lee, D. Y. Liu, S. C. Yao. Flow instability of evaporative micro-channels. International Journal of Heat and Mass Transfer. 53 (2010) 1740-9.

[24] K. Balasubramanian, P. S. Lee, L. W. Jin, S. K. Chou, C. J. Teo, S. Gao. Experimental investigations of flow boiling heat transfer and pressure drop in straight and expanding microchannels—A comparative study. International Journal of Thermal Sciences. 50 (2011) 2413 21.

[25] K. Balasubramanian, P. S. Lee, C. J. Teo, S. K. Chou. Flow boiling heat transfer and pressure drop in stepped fin microchannels. International Journal of Heat and Mass Transfer. 67 (2013) 234-52.

[26] V. S. Duryodhan, A. Singh, S. G. Singh, A. Agrawal. Convective heat transfer in diverging and converging microchannels. International Journal of Heat and Mass Transfer. 80 (2015) 424-38.

[27] Y. K. Prajapati, M. Pathak, M. Kaleem Khan. A comparative study of flow boiling heat transfer in three different configurations of microchannels. International Journal of Heat and Mass Transfer. 85 (2015) 711-22.

[28] A. Mukherjee, S. G. Kandlikar. The effect of inlet constriction on bubble growth during flow boiling in microchannels. International Journal of Heat and Mass Transfer. 52 (2009) 5204-12.

[29] A. Kolar, C. J. Kuo, Y. Peles. Suppression of Boiling Flow Oscillations in Parallel Microchannels by Inlet Restrictors. Journal of Heat Transfer. 128 (2006) 251-60.

[30] G. Wang, P. Cheng, A. E. Bergles. Effects of inlet/outlet configurations on flow boiling instability in parallel microchannels. International Journal of Heat and Mass Transfer. 51 (2008) 2267-81.

[31] S. Szczukiewicz, N. Borhani, J. R. Thome. Two-phase heat transfer and highspeed visualization of refrigerant flows in 100×100 μm2 silicon multi-microchannels. International Journal of Refrigeration. 36 (2013) 402-13.

[32] C. Fang, M. David, A. Rogacs, K. Goodson. Volume of Fluid Simulation of Boiling Two-Phase Flow in a Vapor-Venting Microchannel. Frontiers in Heat and Mass Transfer. 1 (2010).

[33] M. P. David, J. Miler, J. E. Steinbrenner, Y. Yang, M. Touzelbaev, K. E. Goodson. Hydraulic and thermal characteristics of a vapor venting two-phase microchannel heat exchanger. International Journal of Heat and Mass Transfer. 54 (2011) 5504-16.

[34] S. Zhang, W. Yuan, Y. Tang, J. Chen, Z. Li. Enhanced flow boiling in an interconnected microchannel net at different inlet subcooling. Applied Thermal Engineering. 104 (2016) 659-67.

[35] S. Zhang, Y. Tang, W. Yuan, J. Zeng, Y. Xie. A comparative study of flow boiling performance in the interconnected microchannel net and rectangular microchannels. International Journal of Heat and Mass Transfer. 98 (2016) 814-23.

[36] S. Zhang, Y. Sun, W. Yuan, Y. Tang, H. Tang, K. Tang. Effects of heat flux, mass flux and channel width on flow boiling performance of porous interconnected microchannel nets. Experimental Thermal and Fluid Science. 90 (2018) 310-8.

[37] W. Li, X. Qu, T. Alam, F. Yang, W. Chang, J. Khan, et al. Enhanced flow boiling in microchannels through integrating multiple micro-nozzles and reentry microcavities. Applied Physics Letters. 110 (2017).

[38] S. J. Kline, F. A. McClintock, Describing uncertainties in single-sample experiments, Mech. Eng. 75 (1953) 3e8.

SUMMARY OF THE INVENTION

The present invention provides an effective configuration based on the lateral heat exchange between neighboring channels using a counter flow design. The use of a microchannel heat sink with counter flow, and optionally diverging, microchannels enhances the flow boiling performance. In some embodiments, a unique and significant heat exchange between neighboring microchannels may dramatically alter the flow pattern transition in the counter-flow microchannels. The innovative counter flow design results in significantly better use of the base area by employing diverging microchannels (between zero and 1°) giving a larger ratio of channel wall area to base area. Therefore, a significantly higher heat dissipation rate is demonstrated for a specific mass flux. This creates a heat sink with a significantly higher heat transfer coefficient, critical heat flux, more uniform temperature distribution, stable two-phase flow, and lower pressure drop. As the microchannel heat sinks demonstrate excellent flow boiling performance and very high coefficient of performance of heat dissipating rate to pumping power, embodiments of the invention offer a highly promising microchannel design for a variety of applications requiring high heat flux dissipation. The working fluid/refrigerant may be delivered vertically or at other selected angles into each microchannel inlet independently without affecting the outlet flow. In particular, as the flowing bubbles in the microchannels can shrink or even disappear prior to exiting through the outlets, no back flow or partial dry-out is observed. Therefore, the additional heat transfer mechanism in the present design enables significant enhancement of temperature uniformity, up to a heat flux of 2677 kW·m$^{-2}$ with a 45.1% increment of heat transfer coefficient, 73.8% reduction of pressure drop and 123.1% increment of coefficient of performance when compared with those of conventional co-current flow design.

The convective boiling and two-phase flow in such heat sink with counter flow divergent microchannels has been studied in detail. In particular, the interaction between the two neighboring channels with counter flow is studied through high-speed visualization. The inlet subcooled liquid flow with possible boiling may remove part of the heat from the downstream region of the neighboring channels with active boiling and or evaporation prevailing and thus results in a significantly higher heat transfer capability with much lower two-phase pressure drop for a specific mass flux, as compared with that for the traditional co-current flow design. Such a lateral heat transfer may also make the two-phase flow more stable. Moreover, it may also provide a more uniform heat transfer rate over the heated area and, thus, a more uniform temperature distribution. The counter flow microchannel array design also enables a heat sink with a large heat transfer area for practical applications.

In one aspect, the present invention provides a microchannel heat sink with plural (that is, two or more) microchannels. Each of the plural microchannels has a respective inlet and outlet and is arranged to permit flow, in particular two-phase flow, of a working fluid. The plural microchannels are arranged such that adjacent microchannels accommodate flow of working fluid in opposite directions and are thermally coupled to each other to enable heat exchange between the corresponding adjacent microchannels. In one aspect, a microchannel inlet is positioned at an angle with respect to its outlet. For example, the angle may be approximately 90 degrees, but other angles may also be used. The plural microchannels define parallel longitudinal axes that are optionally arranged on the same plane and/or side-by-side in a single layer. Further, in one aspect, each microchannel cross sectional area increases as the channel length progresses from an upstream end (e.g., adjacent to the inlet) to a downstream end (e.g., adjacent to the outlet) of the corresponding microchannel.

BRIEF DESCRIPTION OF THE DRAWINGS

FIGS. 4A-4F show flow patterns; 4A, 4C, and 4E show flow patterns for comparative CCDM heat sinks while FIGS. 4B, 4D, and 4F show flow patterns for a CFDM heat sink of the present invention;

FIGS. 11A-11C depicts pressure drops of CCDM and CFDM heat sinks under three different conditions.

DETAILED DESCRIPTION

The present invention provides microchannel heat sinks and thermal management systems using the heat sinks. The microchannel heat sinks use expanding microchannels with diverging angle sidewalls (between zero and 1°) and counter flow coolant organization; with this configuration, the heat transfer performance, including heat transfer coefficient and critical heat flux, can be significantly enhanced and the two-phase flow instability can be eliminated. Different flow directions in the counter-flow manifold microchannels provide extra heat exchange interaction, which further improves the temperature uniformity of the heat sink area. Additionally, the unique configuration of microchannels can greatly reduce the pressure drop and, consequently, so the pumping power. As a result, the coefficient of performance, COP, defined as heat dissipating rate to the pumping power, is greatly enhanced, with values up to 18000 demonstrated in the Example below. The invention may be applied to the cooling of high-power electronic devices, which have high heat flux dissipation demand. These devices include, for example, high power inverters in electric vehicles, high-power LED lights, and integrated circuit chips.

The symbols used in the specification are defined below:

| Nomenclature | |
| --- | --- |
| $A_b$ | base area of heat sink, m$^2$ |
| $A_c$ | inlet cross-section area of the microchannels, m$^2$ |
| CHF | critical heat flux, kW · m$^{-2}$ |
| COP | coefficient of performance |
| $C_p$ | specific heat, J · kg$^{-1}$ · K$^{-1}$ |
| d | copper substrate thickness, m |
| G | mass flux, kg · m$^{-2}$ · s$^{-1}$ |
| HTC/$h_{tp}$ | two-phase heat transfer coefficient, kW · m$^{-2}$ · K$^{-1}$ |
| $k_{cu}$ | thermal conductivity of copper, W · m$^{-1}$ · K$^{-1}$ |
| $\dot{m}$ | mass flow rate, kg · s$^{-1}$ |
| ONB | onset of nucleate boiling |
| $P_{in}$ | pressure at inlet, kPa |
| $P_{out}$ | pressure at outlet, kPa |
| $Q_{eff}$ | heat transfer rate to fluid, W |
| $Q_{loss}$ | heat loss rate, W |
| $Q_{pump}$ | energy consumption of pumping, W |

-continued

| | |
|---|---|
| $Q_{total}$ | total heat input rate to heat sink, W |
| $q_b$ | heat flux imposed on base area, kW · m$^{-3}$ |
| $T_a$ | ambient temperature, °C. |
| $T_{in}$ | inlet temperature, °C. |
| $T_{out}$ | outlet temperature, °C. |
| $T_s$ | heat sink temperature, °C. |
| $T_{sat}$ | saturation temperature, °C. |
| $T_w$ | wall surface temperature, °C. |
| $\dot{V}$ | volumetric flow rate, m$^3$ · s$^{-1}$ |

| Greek symbols | |
|---|---|
| Δ | difference of parameters |
| ρ | density, kg · m$^{-3}$ |

Figure 2A:
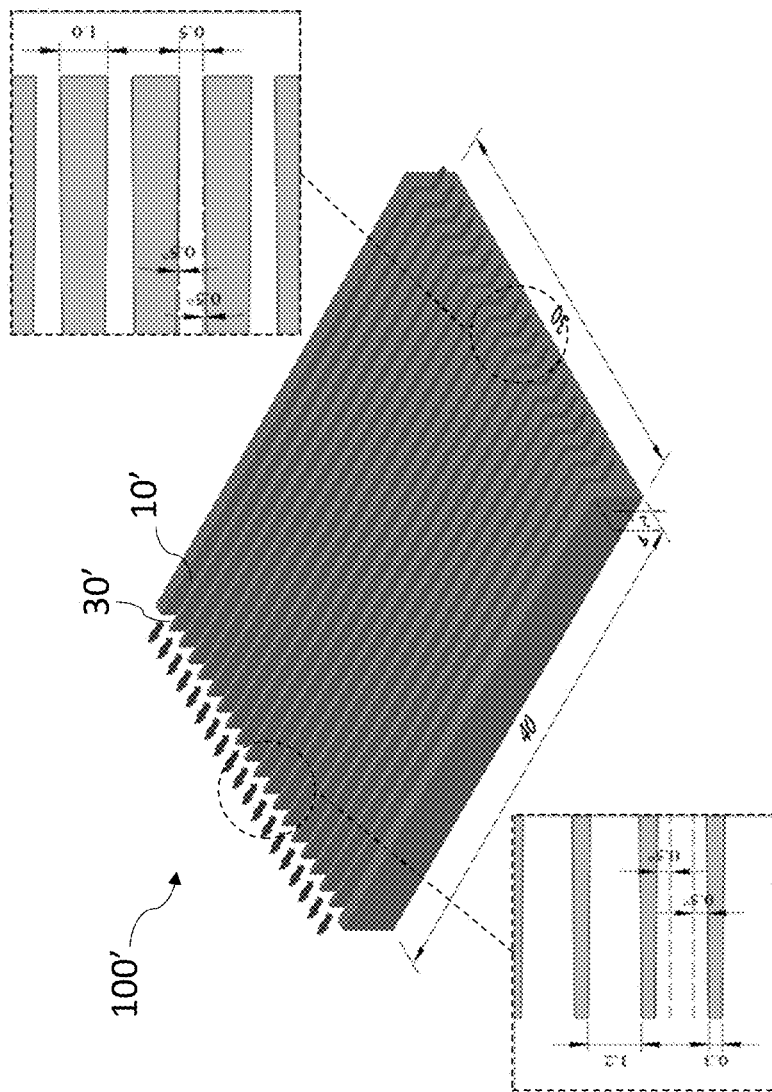
FIGS. 2A-2C illustrate microchannel heat sinks and the placement of thermocouples in the heat sinks.
Figure 2B:
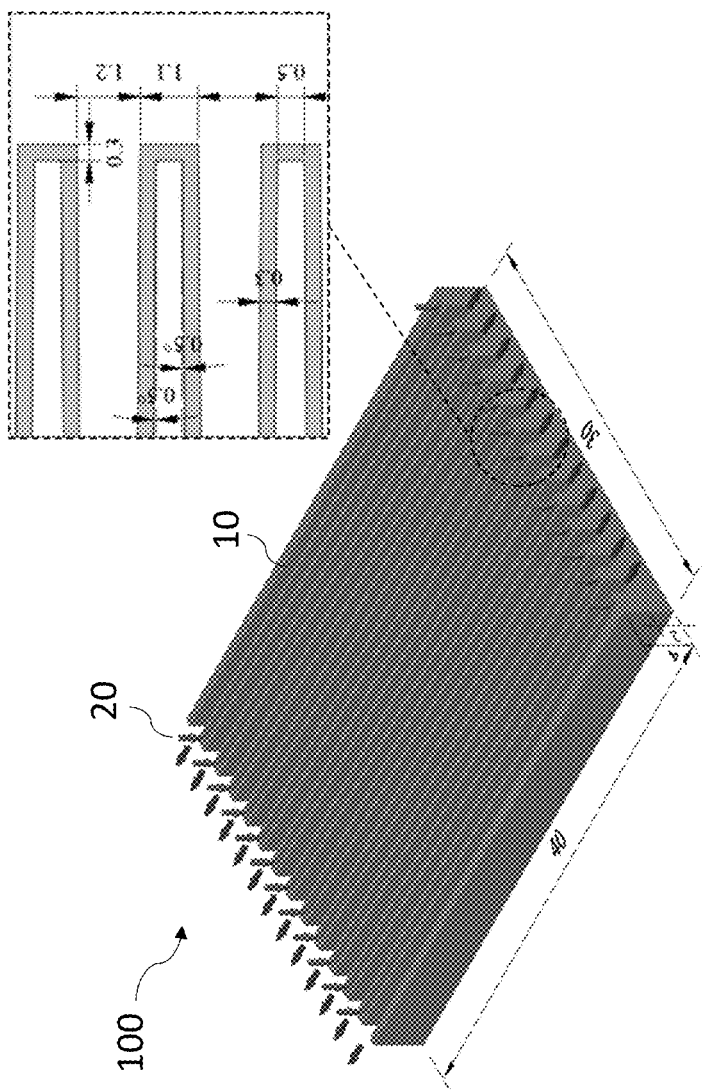

Turning to the drawings in detail, FIG. 2B depicts a microchannel heat sink 100 according to an embodiment of the present in invention. As seen in FIG. 2A, the microchannel heat sink has plural (that is, two or more) microchannels 10. Each of the plural microchannels has a respective inlet 20 having an inlet opening and an outlet 30 having an outlet opening as indicated by the arrows, and is arranged to permit flow, in particular two-phase flow, of a working fluid. As used herein, the term "working fluid" relates to a thermal transfer fluid with one or more types of liquid or gas. Exemplary working fluids include water, refrigerants (e.g., FC-72, HFE-7100, R-134a), alcohol, and ammonia. The plural microchannels are arranged such that adjacent microchannels accommodate flow of working fluid in opposite directions and are thermally coupled to each other to enable heat exchange between the corresponding adjacent microchannels. As seen in FIG. 2B, in the microchannel heat sink 100 an inlet 20 is positioned at an angle with respect to its corresponding outlet 30. For example, as seen in the embodiment of FIG. 2B, the angle is approximately 90 degrees, but other angles may also be used.

The plural microchannels define parallel longitudinal axes that are optionally arranged on the same plane and/or wherein side-by-side in a single layer. Further, in the microchannel heat sink 100 each microchannel cross-sectional area increases as the channel length progresses from an upstream end (e.g., adjacent to the inlet) to a downstream end (e.g., adjacent to the outlet) of the corresponding microchannel. Alternatively, each microchannel width increases as the channel length progresses from an upstream end (e.g., adjacent to the inlet) to a downstream end (e.g., adjacent to the outlet). Alternatively, each microchannel depth increases as the channel length progresses from an upstream end (e.g., adjacent to the inlet) to a downstream end (e.g., adjacent to the outlet). In one aspect, the microchannel width can be increased by using a 0.5° diverging angle for each side wall along the length of the microchannel.

The heat sink of FIG. 2B may include microchannel walls made from a thermally-conductive metallic material such as aluminum, an aluminum alloy, copper, a copper alloy, or composite materials. As seen in FIG. 2B, the channel width increases in the direction of the fluid flow while the adjacent channel is also arranged such that the channel width increases in the direction of the fluid flow with the fluid arranged to flow in the opposite direction. In this manner, the adjacent microchannels have a boustrophedonic form, that is, when looking at the heat sink 100 from the side, the channel width increases from right to left in the first channel while the channel width increases from left to right in the next adjacent channel.

Optionally, the microchannel heat sink 100 may include microchannel surfaces that are modified to increase bubble nucleation. To this end, the microchannel surfaces may be roughened through mechanical means or etching, have surface cavities or projections, or include a coating with increased surface roughness or porosity. The heat sink 100 may be formed though machining of sold block of starting material (e.g., a metal block), formed through additive manufacturing (e.g., 3-D printing from metal pastes) or assembled from plural parts (e.g., microchannel walls assembled to a base material, where the walls and base material may be the same or different materials).

Figure 3A:
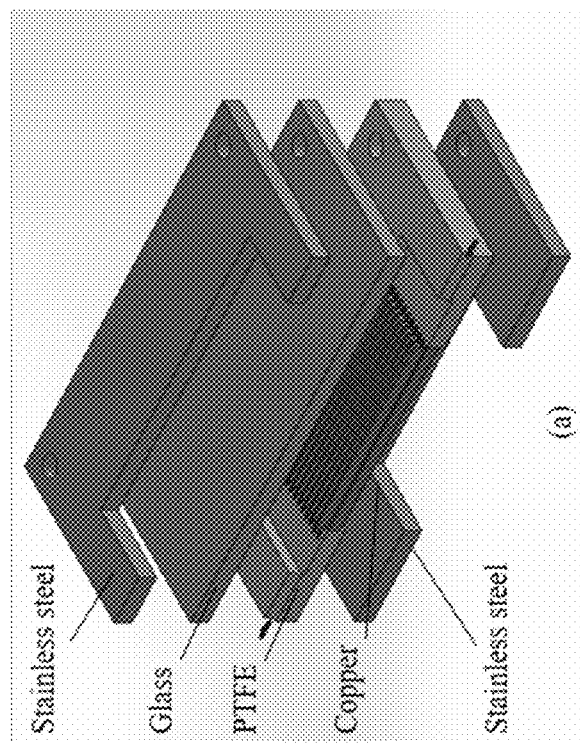
FIGS. 3A-3C depict cover elements and heating blocks for heat sinks.
Figure 3B:
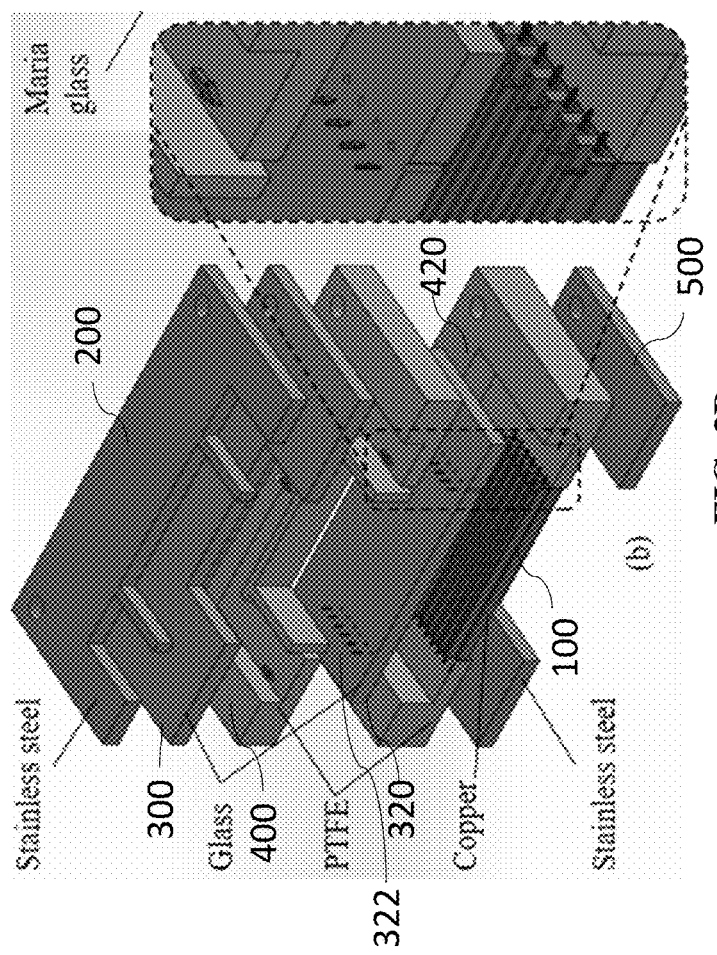

The microchannel heat sink 100 of FIG. 2B may include various optional additional layers for covering the working fluid flow and directing fluid into microchannels 10. These optional additional layers are depicted in FIG. 3B and include a top strengthening layer 200 which may be fabricated from a structural metal such as stainless steel, and transparent layers 300 and 320 (glass, borosilicate glass, silica). Note that the transparent layers are provided to visualize fluid flow and other non-transparent materials may also be used. Layer 320 includes apertures 322 for fluid flow.

An inlet chamber layer 400 is provided and may be fabricated from a polymer such as PTFE; similarly, an outlet chamber layer 420 fabricated from a polymer such as PTFE may be provided adjacent heat sink 100. For optional further strengthening, a bottom strengthening layer 500 may be provided from a structural metal such as stainless steel.

Figure 1:
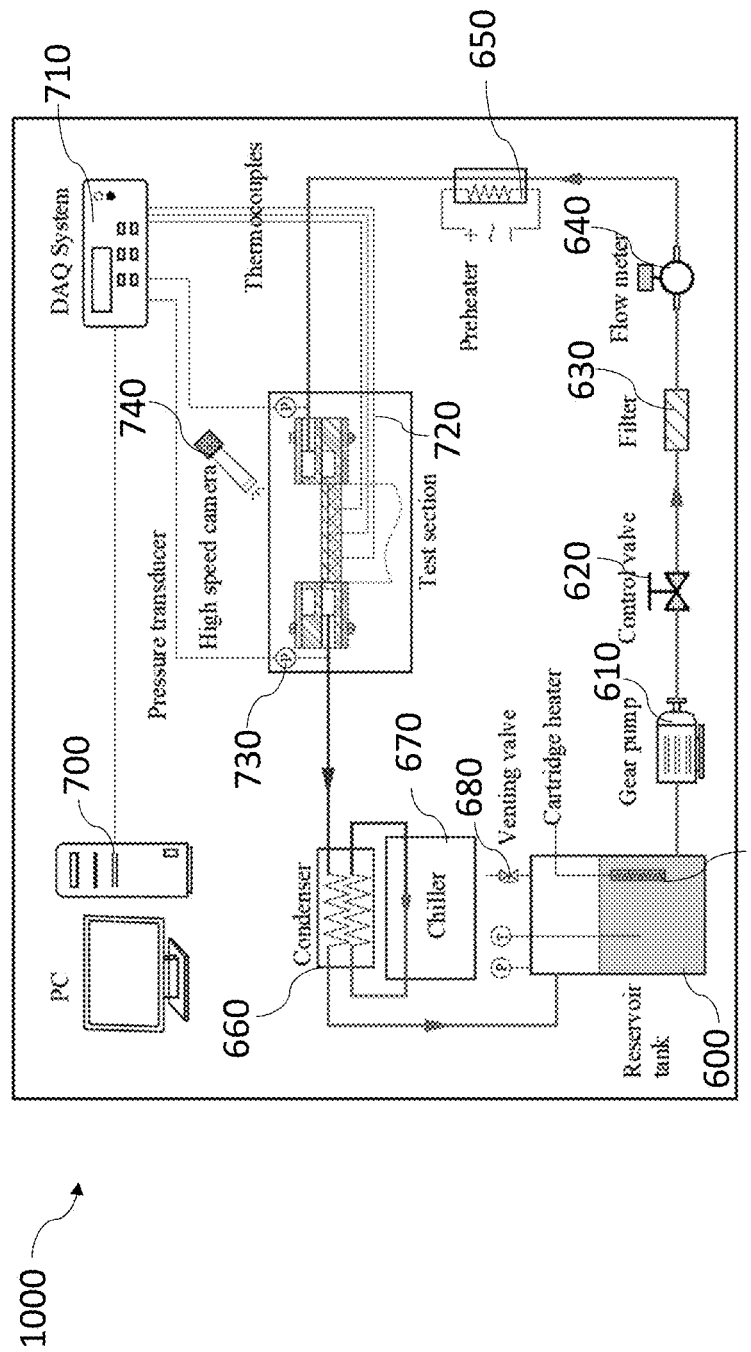
FIG. 1 is a schematic depiction of the thermal management system employing microchannel heat sinks according to an embodiment.

In operation, heat sink 100 forms a part of a thermal management system 1000 as depicted in FIG. 1. Note that FIG. 1 also includes components that are used to test various embodiments of the present invention such as transducers, cameras, and analysis equipment; these elements need not be present in use of the heat sink of the present invention. Thermal management system 1000 includes heat sink 100, and a working fluid storage container such as reservoir 600 for storing a working fluid. The microchannel heat sink 100 is positioned adjacent to a device or component that generates heat to remove the heat from the device or component. A fluid circulation system is fluidly connected with the working fluid storage 600 and the microchannel heat sinks 100 and may include a pump 610 to circulate the working fluid, control valve 620, filter 630, and flow meter 640. After exiting the heat sink 100, the vaporized working fluid may be condensed in condenser 660 and optionally cooled by chiller 670. It is understood that the microchannel heat sink 100 and the thermal management system 1000 that includes heat sink 100 may be incorporated into an electronic vehicle, or used with an electric device or electronic component such as an inverter, an IC chip, an LED light, or a transistor, in particular, power transistors.

The operation of the microchannel heat sinks 100 and the thermal management system 1000 including one or more heat sinks 100, its thermal transfer properties, and further details of the overview presented above are found in the Example section, below.

Example and Comparative Example

Experimental Test Loop

FIG. 1 presents a schematic diagram of test loop for the thermal management system 1000. In the test loop of FIG. 1, the pump 610 is a gear pump (FG300, Fluid-o-Tech), filter 630 is a 10-um filter, and flow meter 640 is an OM004, FLOMEC flowmeter. A preheater 650 is used to heat the working fluid so that a controlled temperature is achieved for test purposes. The gear pump 610 provides forced flow of the working fluid through the loop, while the control valve adjusts the flow rate. The filter prevents any solid contaminants from entering the test section with heat sink 100 and protects the flow meter, which measures the volume flow rate of the working fluid, selected to be deionized water, in this example. The preheater 650, which contains a copper coil immersed inside a constant temperature water bath, heats the working fluid to a specific temperature at the inlet of the test section.

After being heated in test section from the heating block beneath (to simulate waste heat energy from an electronic component, for test purposes), the working fluid becomes a vapor-liquid two-phase mixture. When the working fluid exits the microchannel heat sink 100, it flows into the condenser 660, which may include a copper coiled pipe and cooling water chamber. The chiller 670 provides the continual cooling water to the chamber to condense the vapor and cool down the working fluid. The reservoir tank 600 collects the feedback liquid and provides working fluid to the gear pump, thus, completing the flow loop. In addition, there is a venting valve 680 at a top of reservoir 600 for communicating with the outside environment. A large power cartridge heater 690 is immersed in the reservoir tank 600 to boil off any non-condensable gases for 1 hour before each test.

A synchronized data acquisition system, consisting of a computer 700 and a DAQ system 710 (PXIle-1082, National Instruments) using a custom-designed LabVIEW program, is established to monitor and record the experimental data of flow rate, temperature, and pressure. The temperature, such as inlet temperature and outlet temperature to the test section and heat sink temperature, are measured using T-type thermocouples 720. The inlet and outlet pressures of the test section are measured using pressure transducers 730. The pressure drop is the difference between inlet and outlet pressure. A high-speed camera 740 (Crash Cam-1540, IDT) is employed to visualize the dynamic two-phase flow patterns in the microchannel heat sink 100. A frame rate of 5000 frames per second is set for this example.

The Example of the present invention is performed using different types of microchannel heat sinks. Heat sinks with diverging microchannels are used. Two types of heat sinks are employed: the counter-flow diverging heat sink of FIG. 2B and a co-current flow heat sink depicted in FIG. 2A. The diverging microchannels with co-current or counter current flow designs are fabricated on a copper plate with the similar dimensions of an IGBT power electronic module of 40 mm in length and 30 mm in width. A relatively large heating area (12 cm$^2$) is provided in order to simulate the real cooling demand from such an electronic device. Sharing the consistent basic dimensions, two copper blocks with different microchannel configurations are fabricated to investigate and compare the boiling heat transfer performance and two-phase flow characteristics under various flow rates and heating conditions. The whole test section is firstly designed using CAD software, subsequently fabricated by micromilling and customized housing components are assembled to form the diverging microchannel heat sinks.

FIGS. 2A and 2B depicts the two heat sinks, 100' and 100, with co-current diverging microchannels (CCDM) (FIG. 2A) and counter flow diverging microchannels (CFDM) (FIG. 2B), respectively. For both heat sinks, each microchannel is 40 mm in length, 2 mm in depth and has a 0.5° diverging angle for each side wall. Such a diverging angle is selected as it demonstrates a more stable boiling two-phase flow and better heat transfer performance. Thus, the microchannel width ranges from 0.5 mm at each inlet 20', 20 to 1.20 mm at each outlet 30', 30.

To provide sufficient mechanical strength, a minimum thickness for the microchannel sidewall at the outlet is selected as 0.3 mm for the co-current flow design of FIG. 2A. Consequently, 19 diverging microchannels 10 are arranged on a 40 mm×30 mm fixed area, as illustrated in FIG. 2A. Notably, the width for the wall at the channel inlet may be as thick as 1.0 mm, which is unnecessarily thick and the base heat transfer area is not effectively used in the configuration of FIG. 2A in order to provide an approximately rectangular overall shape. Such a disadvantage can be remedied using a counter flow diverging microchannels (FIG. 2B) with an innovative inlet design. The diverging design keeps the merits of stability and better heat transfer performance and the counter flow design enables full use of the base area. FIG. 2B depicts 25 microchannels on the same base area as the configuration of FIG. 2A with 12 channels in one direction and 13 in the counter direction. The number of channels is much larger than that for the co-current flow design on the same base area, providing greater heat transfer per unit area. The sidewall thickness remains uniformly at 0.3 mm. Therefore, for the same mass flux in each channel, the counter flow design may allow larger total mass flow rate through the heat sink and potentially higher heat transfer capability. The working fluid can be vertically fed into each single microchannel inlet independently. The subcooled fluid from the vertical inlet may cause impinging cooling effect to the channel bottom surface. Such an impinging cooling effect may enhance heat transfers through the sidewall between the cooler inlet in one microchannel and the warmer outlet in the neighboring microchannel. This configuration will retard the growth of void fraction for the flow in the diverging direction and has the great potential to enhance critical heat flux by preventing the early initiation of partial dry out and significantly reduce the two-phase flow pressure drop as well. Moreover, it may possibly maintain a more uniform temperature distribution on a real electronic component. The counter flow design provides nearly equally liquid feed-in with the same temperature on both sides of the heat sink and, therefore, a more uniform temperature distribution.

Figure 2C:
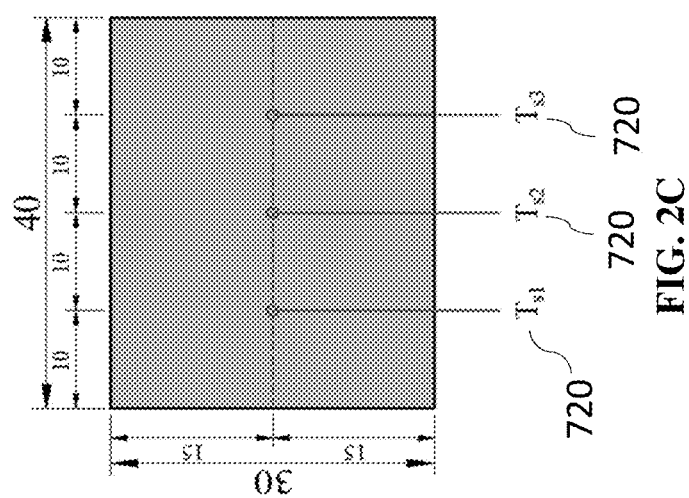
Figure 3C:
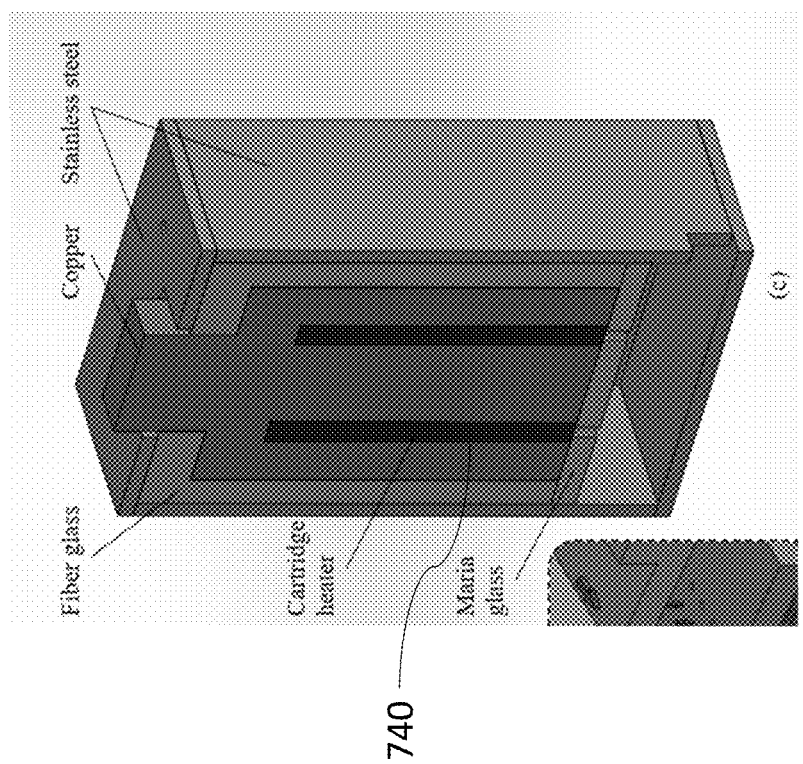

FIG. 2C depicts the location of three thermocouples, which are embedded at 1 mm beneath the channel bottom surface, along the axial central line. Such thermocouple distribution allows the examination of temperature uniformity. The channel surface temperature at the corresponding locations can be acquired through proper extrapolation based on the one-dimensional heat conduction. To match the desired cooling function of the two types of microchannel heat sinks, two housings are customized corresponding to their respective inlet requirement. Generally, the housings consist of several layers, as shown in FIGS. 3A and 3B including the top strengthening layer (stainless steel), transparent layer (borosilicate glass), inlet chamber layer (PTFE), outlet chamber layer (PTFE) and bottom strengthen layer (stainless steel). The strengthening layer provides the mechanical support for the test section, and the transparent layer allows the visualization of two-phase flow in the microchannels. For the CFDM test section, vertical holes 322 with an inner diameter of 0.5 mm, accurately fabricated through laser drilling on the borosilicate glass, allow the liquid to be injected into each microchannel inlet (0.5 mm width×2 mm height) independently. All the components are sealed using high temperature glue and pressed tightly together by bolts and nuts to keep the test module firm. Below the housings is the heating block 740, as shown in FIG. 3C The dimensions of the copper block top surface match the bottom size of the copper heat sinks (40 mm×30 mm). A thin layer of liquid gallium-based alloy with high thermal conductivity is adopted to reduce the thermal resistance between the contact surfaces. Six cartridge heaters (1 kW×6) with adjustable power are inserted into the copper block to provide heating power. The copper block is wrapped with fiber glass to minimize the heat loss. Each component is assembled by bolts and nuts for steadiness. The power supply is controlled by a linear regulator and monitored by a DC power meter.

Experimental Procedures and Data Reduction

To demonstrate the features of the present invention, one of the test sections is assembled upon the heating block and connected to the flow loop under various test conditions. Using deionized water as the working fluid, the flow rate and inlet temperature are set by the gear pump and the preheater, respectively. For the present study, two inlet temperatures of 75° C. and 90° C. and three different mass fluxes at the inlet: 200, 400 and 600 kg·m$^{-2}$s$^{-1}$ are tested, respectively. Before each test, the working fluid is degassed by vigorous boiling for more than 60 minutes while circulating in the flow loop. All the tests in the present study are conducted with the reservoir tank pressure kept at ambient atmosphere using a venting valve at the top of the tank. Step by step increment in heating power of 120 W is adopted for each heating test. Only one parameter of inlet temperature, mass flux at the inlet and heating power is adjusted while keeping the other two parameters unchanged in each experiment. The flow rate, temperature and pressure data are recorded by DAQ system (PXIle-1082, National Instruments) and a self-designed LabVIEW program. After the test section achieves a steady state (characterized by a negligible change in heat sink temperature, i.e., the changes in s1 T, s2 T, s3 T are less than 0.5° C. over a 3-min period). All temperatures, pressures are recorded at 1 Hz for 1 minute. Heat transfer coefficients and pressure drops are thus determined by using the averaged values from the measured data for 1 min. For safety reasons, the test is terminated when the CHF (critical heat flux) occurs or the highest sink temperature exceeds 140° C. For the present study, CHF never took place.

Data Reduction

A series of single-phase heat transfer experiments are conducted to evaluate the heat loss rate loss Q during the heating process. The heat loss rate can be determined based on energy balance:

$$Q_{loss} = Q_{total} - Q_{eff} \tag{1}$$

where $Q_{total}$ denotes the total input power, which is directly monitored and measured by the DC power meter. $Q_{eff}$ is the effective heating power to the working fluid during the single-phase forced convection tests, which can be determined from temperature measurement at the inlet and outlet as:

$$Q_{eff} = \dot{m} C_p (T_{out} - T_{in}) \tag{2}$$

where $C_p$ denotes the specific heat of fluid, $\dot{m}$ denotes the mass flow rate, which is calculated from the volumetric flow rate $\dot{V}$, measured as $$\dot{m} = \dot{V} \rho \tag{3}$$

where $\rho$ is the fluid density. The mass flux G at the channel inlet can be readily evaluated by definition:

$$G = \dot{m}/A_c = \dot{V}\rho/A_c \tag{4}$$

where $A_c$ is the cross section at the channel inlet.

The heat loss rate $Q_{loss}$ under single-phase convection is found to be approximately proportional to the difference between the average sink temperature $T_s$ and ambient temperature $T_a$. Therefore, such a linear relationship is further extrapolated to such temperatures in the two-phase flow region to estimate the heat loss rate in the two-phase region. The heat absorbed by the working fluid in the two-phase region $Q_{eff}$ can then be calculated using Eq. (1) when $Q_{loss}$ is obtained. The effective base heat flux is given by $$q_b'' = \frac{Q_{eff}}{A_b} \tag{5}$$

Where $A_b$ is the base area of the microchannel heat sink, $A_b = W \times L$, in which W and L are the width and length of the microchannel heat sink, respectively.

The local wall temperature corresponding to a heat sink temperature measured can be calculated by one-dimension heat conduction assumption as:

$$T_{w,i} = T_{s,i} - \frac{q_b'' d}{k_{cu}}, i = 1, 2, 3 \tag{6}$$

where d denotes the copper substrate thickness between the thermocouple location and bottom surface of the microchannels, $k_{cu}$ denotes the copper thermal conductivity, and $T_{s,i}$ denotes the local heat sink temperature, directly measured by the corresponding T-type thermocouple. The heat transfer coefficient can then be calculated as:

$$h_{tp} = \frac{q_b''}{T_w - T_{sat}} \tag{7}$$

where $T_w$ is the maximum wall temperature, which is the temperature corresponding to the heat sink temperature near the exit for the CCDM design and corresponding to the middle one for the CFDM. Owing to the different coolant flow arrangements, the local wall temperature $T_{w1}$, $T_{w2}$, $T_{w3}$ of the two designs are with disparate distributions. For the CCDM, similar to conventional microchannel heat sink, the temperature distribution from inlet to outlet presents $T_{w1} < T_{w2} < T_{w3}$ along the coolant flow direction.

However, the temperature distribution of the CFDM exhibits $T_{w1} \approx T_{w3} < T_{w2}$ due to the counter flow coolant design. As maintaining the maximum temperature is a priority issue for protecting an electronic device, the highest wall temperature is adopted as the wall temperature for boiling curve and heat transfer coefficient. On the other hand, $T_{sat}$ is the saturation temperature corresponding to the fluid pressure near the corresponding thermocouple for the highest wall temperature. For the CCDM design, it is the local pressure, estimated from the outlet pressure based on the linear pressure distribution in the flow direction, at the position consistent with wall temperature $T_{w3}$, while the CFDM is the average pressure of inlet and outlet being consistent with wall temperature $T_{w2}$. Notably, the pressure drop through the channel increases with increase in heating power; consequently, the saturation temperature also varies with heating power. The higher the heating power is, the higher the saturation temperature. The pressure drop across the microchannel is given by $$\Delta P = P_{in} - P_{out} \tag{8}$$

where $P_{in}$ and $P_{out}$ are inlet pressure and outlet pressure directly measured by the pressure transducers.

The coefficient of performance is defined as $$COP=Q_{eff}/Q_{pump} \qquad (9)$$

where $Q_{pump}$ is the pumping power to drive the working fluid through the heat sink with a volume flow rate of V:

$$Q_{pump}=\Delta P \dot{V} \qquad (10)$$

Uncertainty analysis: The instrument error includes the uncertainty of the temperature measured by the T-type thermocouples, the uncertainty of the pressure transducers, and the measurement error of flow meter. The uncertainties of T-type thermocouple, pressure transducer and volume flow rate are ±0.5° C., ±0.5% and ±1%, respectively. The heating power measured by the digital DC power meter yields an uncertainty of ±1%. Provided by the manufacturer, the uncertainty of mechanical machining on microchannels heat sink is ±0.02 mm. The wall temperature uncertainty comes from the uncertainty of temperature measurement and from the correction of the temperature drop through the copper block. According to the propagation of uncertainty proposed by Kline and McClintock [38], the experimental uncertainty for—28—a certain derived variable, such as base heat flux, mass flux, HTC can be calculated. The uncertainties of the major parameters are listed in Table 1.

| Parameters | Uncertainties | |
| --- | --- | --- |
| Estimated under inlet temperature | $T_{in}$ = 75° C. | $T_{in}$ = 90° C. |
| Base heat flux $q_b''$ | 1.70% | 1.62% |
| Mass flux G | 4.24% | 4.24% |
| Wall superheat $T_w$-$T_{sat}$ | 1.95% | 1.92% |
| HTC $h_{tp}$ | 2.59% | 2.51% |
| Pressure drop $\Delta P$ | 0.71% | 0.71% |

Two-Phase Flow Patterns

High speed flow visualization is implemented for better understanding of the two-phase flow phenomena and heat transfer mechanism. FIGS. 4A, 4C, and 4E and FIGS. 4B, 4D, and 4F depict a series of typical flow boiling images under the condition of mass flux G=200 kg·m-2·s$^{-1}$ and inlet temperature Tin=90° C. in (a) CCDM heat sink and (b) CFDM heat sink, respectively, for low, medium and high heat fluxes. Although the visualization covers all channels in the heat sink, only three and four channels are sampled for CCDM heat sink 100' and CFDM heat sink 100, respectively, to illustrate the dynamic bubble characteristics while moving. Since the CFDM heat sink is with vertical liquid fed-in layout, there is one inlet chamber on each side above the glass layer, thus the visualization length is somewhat shorter than that of the CCDM. To facilitate direct comparison of the flow pattern in the two heat sinks, black dash lines showing the boundaries corresponding to the visualization window of CFDM are marked in each image for CCDM.

Figures 4A, 4B:
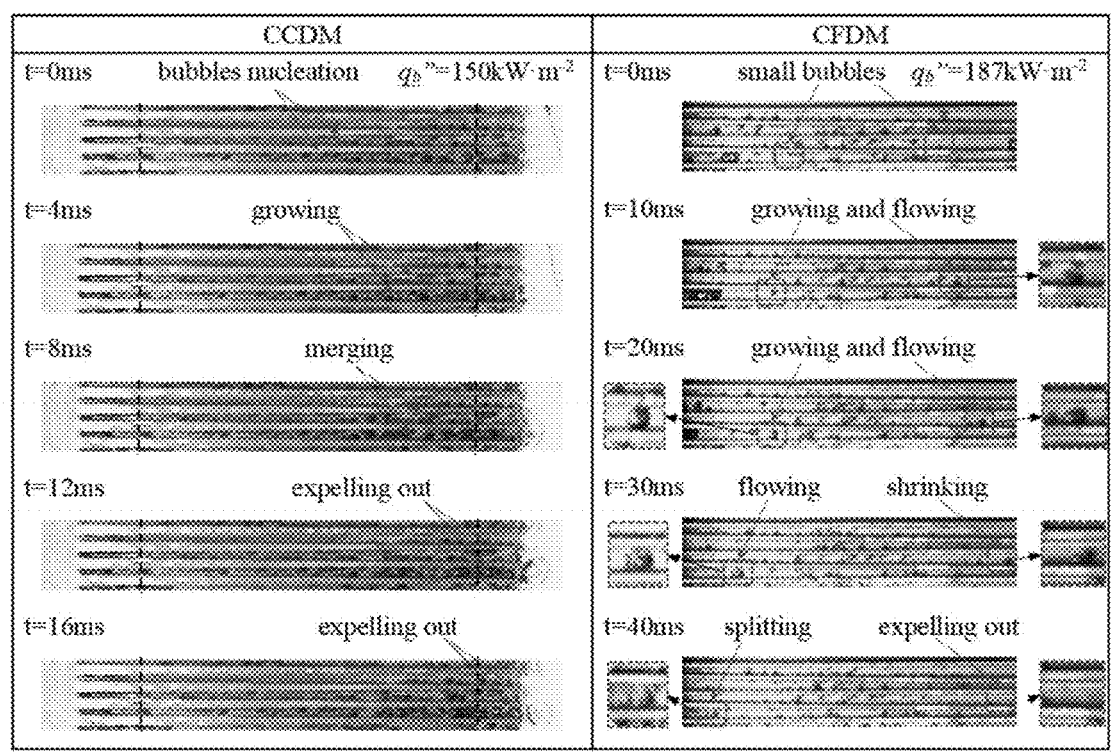
Figures 4C, 4D:
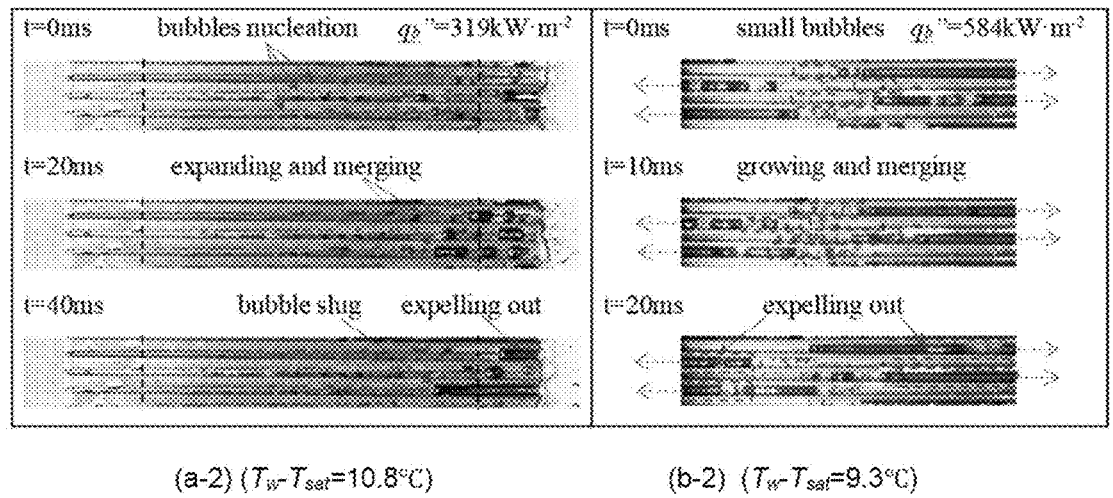

FIGS. 4A, 4C, and 4E and FIGS. 4B, 4D, and 4F show typical time-varying bubble images of the two samples under various base heat flux conditions. Each comparison group is shown under approximately the same wall superheat, within 1-2° C. difference. For a low heat flux of 150 kW·m$^{-2}$, FIG. 4A shows numerous tiny bubbles generated in the middle and downstream section in the CCDM heat sink. The bubbles continuously grow, and randomly depart from the bottom surface as time evolves. The bubbles grow, merge, elongate and flow out of the microchannels with little impediment. However, the evolution of bubbles is quite different and form a unique flow pattern in the microchannels of CFDM heat sink. Many tiny bubbles are nucleated in the central section of microchannels, gradually grow larger and then depart from the bottom surface flowing with the mainstream downstream. While passing through the downstream, most flowing bubbles shrink, even totally disappear before they reach the exit. In the images, two typical bubbles in opposite flow directions are marked to demonstrate the bubble evolution. The left bubble is generated at some time, say t=0 ms. It grows larger during the following 20 ms, and reaches the maximum size at t=20 ms. At t=30 ms, this large bubble begins to split while flowing towards the downstream direction. After that, the bubble continuously shrinks and splits into two smaller bubbles, though not very clearly, at t=40 ms. It is speculated that these two bubbles will separate with each other while flowing further downstream. Another chosen bubble on the right side is nucleated at t=0 ms. It then flows with mainstream and gradually expand to a maximum size at t=20 ms. This bubble shrinks rapidly to a tiny one in the following 20 ms, and eventually exits the visualization window. FIG. 4C and FIG. 4D illustrate the flow boiling images when the base heat flux increase to a median level. In the CCDM heat sink, small bubbles are generated in the middle section, and quickly expand to large bubbles in the next 20 ms, then they merge with each other to form a bubble slug. Finally, these elongated large bubble slugs expel out in the channel exit. As for the CFDM heat sink, there are also many small bubbles generated in the central part. The bubbles grow faster than the bubbles at low heat flux do. As marked in the dash line frames, some bubbles may expand towards the downstream direction and quickly merge into the large slug and flow to the exit smoothly.

Figures 4E, 4F:
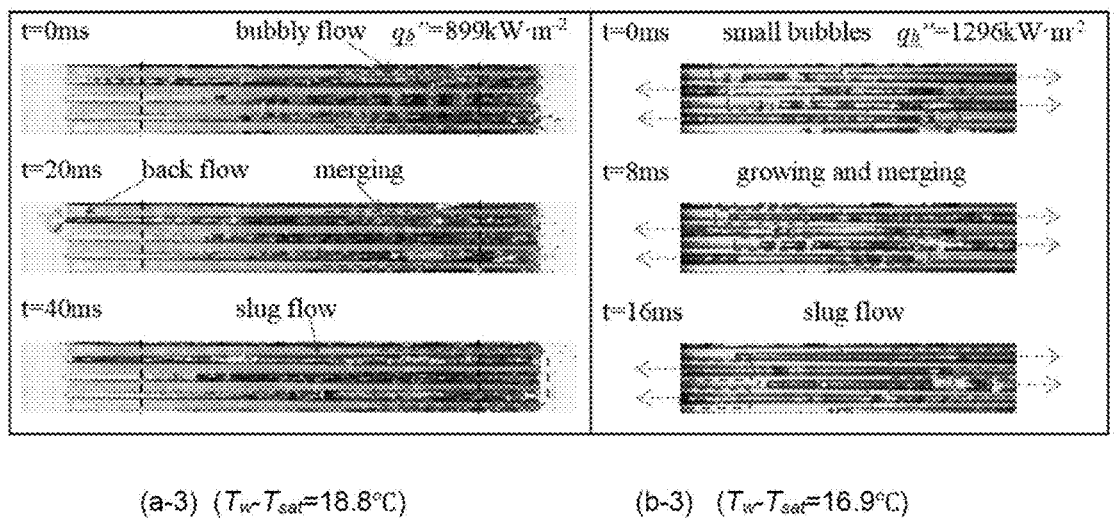

The flow patterns for high heat flux tests are depicted in FIG. 4E and FIG. 4F. A violent heat exchange process with flow oscillation in the CCDM heat sink are captured. Bubbles are generated much close to the inlet in the upstream and expand quickly. The confined large bubbles elongate and merge with each other, then rapidly occupy a large portion of the channel during the following 20 ms. It can be seen that the long bubble slug impedes the first microchannel and almost blocks the liquid flow passage. The bubble slug further expands in the reverse direction resulting in the so-called back flow, which is undesirable as it can lead to dramatic deterioration of heat exchange in the microchannel. The impeding slug around the inlet lasts for the next 20 ms, and, later, the liquid feeds into the channel again.

In contrast, steady two-phase flow prevails in all the microchannels of the CFDM heat sink 100. Similar to its medium heat flux situation, the bubbles nucleate, expand and merge into a slug downstream. However, due to high heat flux imposed, bubble development becomes much faster. Even with such a rapid process, the convective boiling always maintains a steady manner, no back flow or any partial dry-out occurs.

Figure 5:
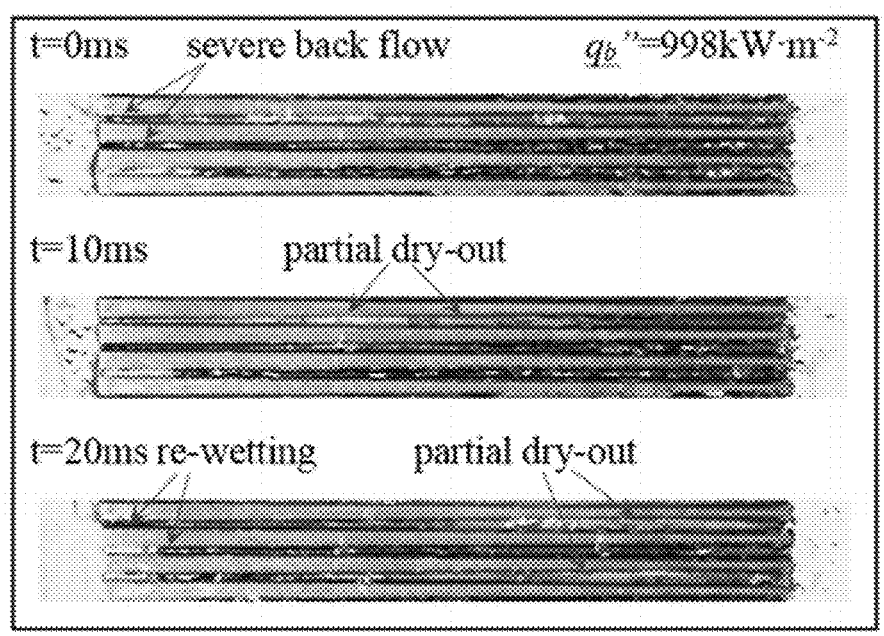
FIG. 5 depicts a partial dry-out of a comparative CCDM heat sink.

With a further increase in the heat flux of the CCDM heat sink, partial dry-out occurs in some microchannels as shown in FIG. 5. Due to a long-duration slug impediment in the channel inlet, the thin film liquid covering on the downstream bottom wall surface evaporates quickly without liquid replenishment in time resulting in dry-out at that position. During the following 10 ms interval, liquid replenishes the channel and periodically cools down such hot spots. The lateral heat transfer between neighboring channels could be more pronounced if the inlet mass flux is increased and the inlet temperature is lowered.

Figure 6:
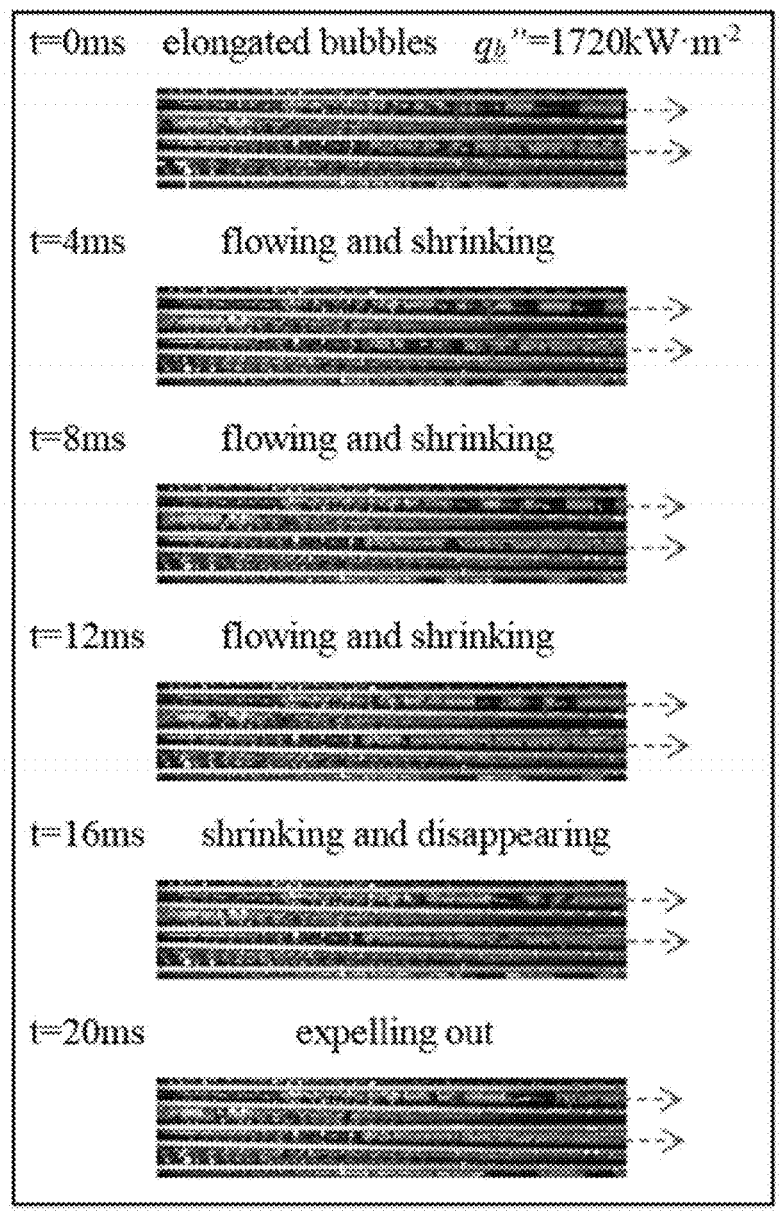
FIG. 6 shows the flow pattern of a CFDM heat sink of the present invention.

FIG. 6 illustrates the flow pattern in the CFDM heat sink for mass flux of

G=600 kg·m$^{-2}$·s$^{-1}$ and inlet temperature of Tin=75° C. Under such a condition with a relatively large mass flux and relatively low inlet temperature condition, the merits brought by the counter-flow design of the present invention becomes more pronounced. While dissipating a relatively high heat flux of 1720 kW·m$^{-2}$, the flowing vapor-liquid downstream is cooled significantly by the highly subcooled liquid in the neighboring channel and the bubbles experience great volume reduction while flowing forward, even shrink to disappear before reaching the exit, as the dash line indicates. Consequently, partial dry-out is prevented from occurring and overall heat transfer will be significantly enhanced for such a case with relatively high heat flux.

Figure 7A:
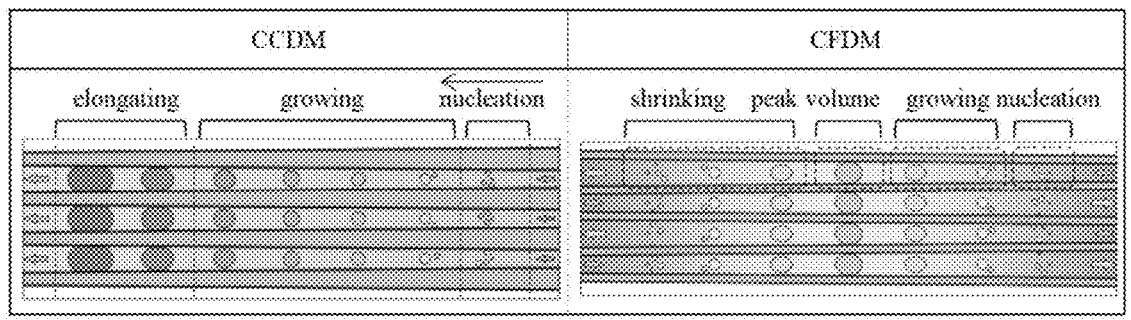
FIGS. 7A-7C show schematic flow patterns for CCDM and CFDM heat sinks for low heat flux, median heat flux, and high heat flux.
Figure 7B:
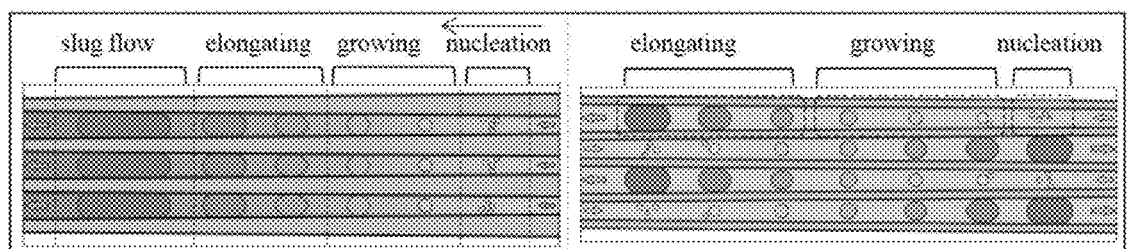
Figure 7C:
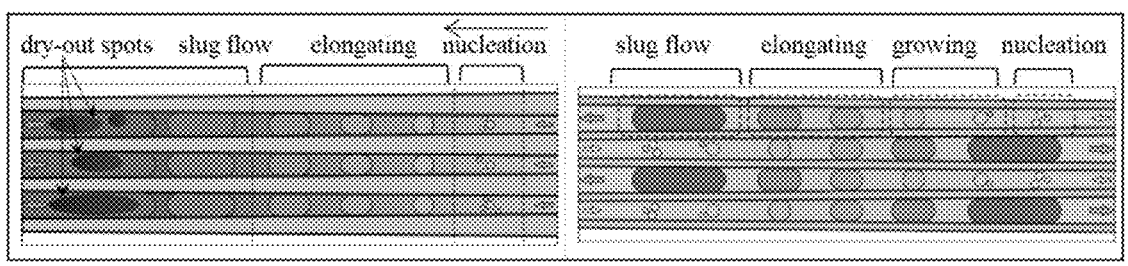

In summary, FIG. 7A-C clearly illustrates the schematics of the flow pattern in CCDM and CFDM heat sinks for three levels of heat flux. In the CCDM heat sink, tiny bubbles nucleate from and depart the bottom surface, continuously grow to confined bubbles, and finally move to the exit. The confined bubble near the exit becomes longer and longer when the heat flux is increased. Reversed flow and partial dry-out may take place if the heat flux is high. In contrast, the heat transfer between neighboring channels demonstrates a significant effect on the bubble behavior in the CFDM heat sink of the present invention. At low heat flux levels, bubbles generally grow relatively slowly and reach the maximum size in the middle section, and then shrink, or even disappear while passing through downstream. At medium heat flux level, bubbles grow faster, compared with that at low heat flux level, and become a confined bubble, possibly shrink, in the downstream area. At high heat flux level, bubbles are generated more frequently and grow faster in the upstream area, merge into downstream slug flow and expel out rapidly. No back flow or partial dry-out takes place even under the highest heat flux condition of the heat sinks of the present invention.

Heat Transfer Performance

Figures 8A, 8B:
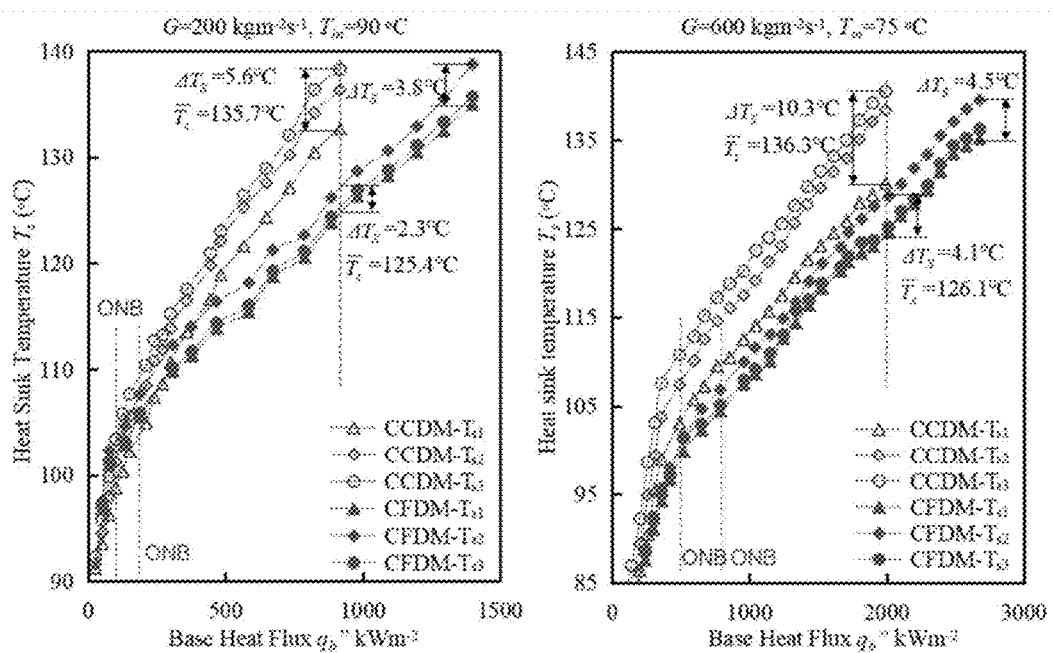
FIGS. 8A-8B show axial temperature distributions of two microchannel heat sinks.

Temperature Uniformity:

Corresponding to the previous two groups of flow patterns, the heat sink temperature distribution in the axial direction as a function of heat flux is depicted in FIG. 8A-B. As described earlier, the heat sink temperature is measured using three T$_{type}$ thermocouples inserted into the copper sink and denoted as Ts1, Ts2 and Ts3 along the flow direction. FIG. 8A-B indicates that for a given heat flux, the CFDM heat sink 100 usually presents much lower heat sink temperature than that of the CCDM heat sink. The figure also shows that in the single-phase convection region, heat flux is low and heat sink temperature is relatively uniformly distributed and increases very rapidly with heat flux. Temperature non-uniformity begins to appear and the slope of the temperature rise becomes much smaller after the onset of nucleate boiling (ONB) taking place in the microchannels. This may be attributed to the significantly better boiling heat transfer. In the CCDM heat sink, the temperature increases in the axial direction and the maximum temperature appears at the most downstream location, i.e., Ts3. In contrast, in the CFDM heat sink, the heat transfer between the neighboring channels results in the maximum temperature locating at the middle points, i.e., Ts2. As also indicated earlier, these maximum temperatures are used to extrapolate the maximum wall temperature for boiling curves in CCDM and CFDM heat sinks, respectively. The CFDM heat sink 100 of the present invention not only provides a lower temperature but also more uniform temperature distribution than that for the CCDM. The temperature non-uniformity of the CCDM, defined as $\Delta T_s = T_{s3} - T_{s1}$ increases with increase in the base heat flux and reaches $\Delta T_s = 5.6°$ C.

for the case of G=200 kg·m$^{-2}$·s$^{-1}$ and Tin=90° C., while the mean sink temperature $\overline{T}_s = (T_{s1} + T_{s2} + T_{s3})/3 = 135.7°$ C.

When dissipating the same base heat flux, the CFDM heat sink 100 of the present invention outperforms the CCDM significantly. Not only a lower average sink temperature of $\overline{T}_s = 125.4°$ C.

is attained, but also a much lower temperature non-uniformity of $\Delta T_s = T_{s2} - T_{s1} = 2.3°$ C.

Temperature non-uniformity is more pronounced under the condition of a larger mass flux of G=600 kg·m$^{-2}$·s$^{-1}$ and a lower inlet temperature of Tin=75° C. The temperature non-uniformity for the CCDM heat sink is 10.3° C. for the base heat flux of 2000 kW·m-2, while it is 4.1° C. in the CFDM if the same heat flux is applied.

Figure 9A:
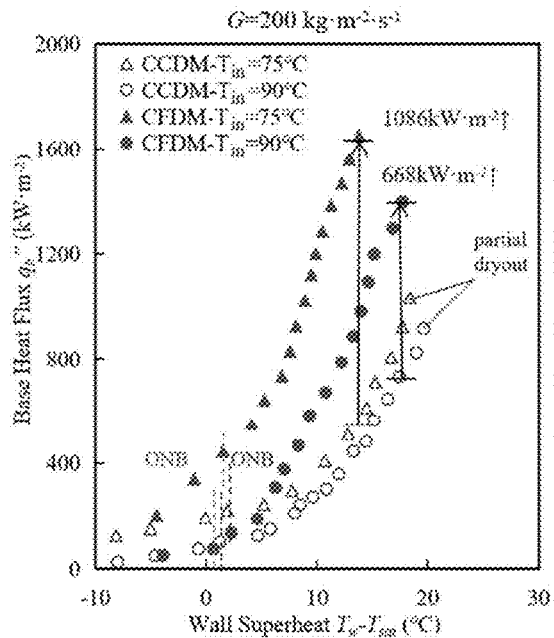
FIGS. 9A-9C show boiling curves for CCDM and CFDM heat sinks under three flux conditions.
Figure 9B:
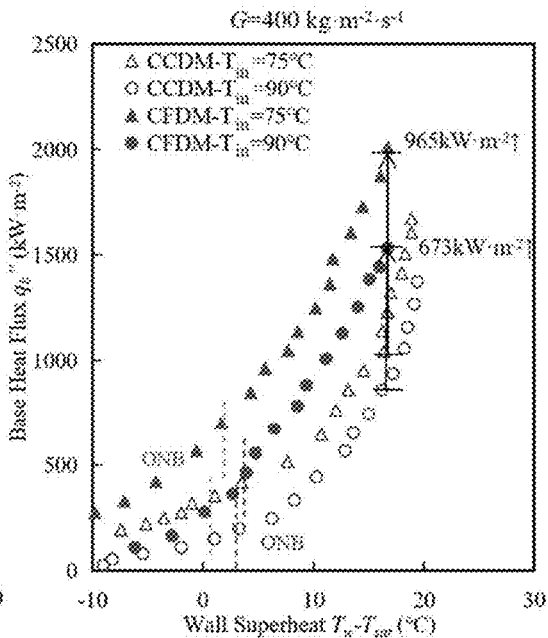
Figure 9C:
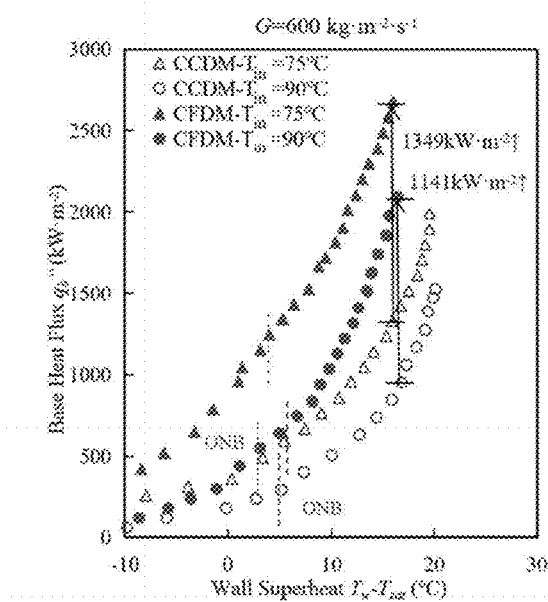

Boiling Curves:

FIG. 9A-C illustrates and compares the boiling curves of the CCDM and CFDM heat sink, respectively, at different mass fluxes at the inlet. For a low mass flux at the channel inlet of G=200 kg·m$^{-2}$·s$^{-1}$, FIG. 9A shows that CCDM and CFDM exhibit nearly the same heat exchange capability during the initial single-phase regime. After the onset of nucleate boiling (ONB), the boiling curves for both designs at different inlet temperatures increase with a steeper slope, which dramatically demonstrates the rise in the heat transfer rate under a small wall superheat comparing to that in the single-phase regime. Moreover, the boiling curves for the CFDM design of the present invention deviate from those of the CCDM with an even larger slope. This shows immense elevations of the two-phase heat exchange capacity: much higher base heat flux while maintaining smaller wall superheat for the CFDM design. For example, for Tin=75° C., the CFDM heat sink 100 can remove a base heat flux of 1649 kW·m$^{-2}$ with a wall superheat of about 13.8° C., but the CCDM heat sink 100' can take away only 563 kW·m$^{-2}$ with about the same wall superheat. The similar large augmentation of base heat flux also appears in the tests for a higher inlet temperature of 90° C., the CFDM heat sink 100 exhibits 1400 kW·m$^{-2}$ heat exchange capability with a wall superheat of 15.7° C., significantly exceeding that of the CCDM (732 kW·m$^{-2}$) for about the same wall superheat.

Such a significant surplus in the heat removing rate for the CFDM heat sink 100 of the present invention is well beyond the larger total flow rate for the mass flux in each channel in the CFDM heat sink 100 as it has 25 microchannels, which is 32% more than that of the CCDM heat sink 100'. Therefore, there must be additional mechanisms to cause such a large enhancement in the CFDM heat sink 100. Indeed, the flow visualization, as illustrated above, indicates that when the imposed high heat flux in the CCDM heat sink 100' reaches 998 kW·m$^{-2}$ and 1033 kW·m$^{-2}$ for an inlet temperature of 90° C. and 75° C., respectively, the partial dry-out phenomenon appears in the downstream section of the microchannels. During the violent boiling on a large heat dissipation area, the working fluid flow inevitably encounters disorder in some microchannels leading to local dry-out and hot spots. Such a local dry-out may result in the deterioration of heat transfer, even potentially destroying the entire heat sink if the heating power is further increased. In contrast, in the CFDM heat sink 100 of the present invention, the counter flow design results in significantly better heat transfer between neighboring channels, which removes a significant amount of heat from the downstream portion in one channel to the upstream region of the two neighboring channels. This prevents the formation of partial dry-out in the downstream region and, therefore, a much higher overall heat transfer rate FIGS. 9B and 9C illustrate and compare the boiling curves for both CCDM and CFDM heat sinks for mass flux of G=400 kg·m$^{-2}$·s$^{-1}$ and G=600 kg·m$^{-2}$·s$^{-1}$, respectively. The general trends are similar to that for G=200 kg·m$^{-2}$·s$^{-1}$. Here, in the single-phase regime, the CFDM heat sink 100 of the present invention shows demonstrably better heat exchange capacity than that of the CCDM. This may be attributed to the counter flow inlet liquid fed-in layout cooling down the gradually hotter fluid along the passage in the neighboring channels and maintaining the entire heat sink at a lower temperature. After ONBs, the boiling heat flux in the CFDM heat sink rapidly increases and surpass that of the CCDM as the wall superheat increases in the two-phase regime. By setting larger mass fluxes, the maximum heat fluxes corresponding to the wall temperature limit exceeds that for the earlier case for a mass flux of 200 kg·m$^{-2}$ s$^{-1}$. For the mass flux of G=600 kg·m$^{-2}$·s$^{-1}$ and Tin=75° C., the maximum boiling heat flux in the CFDM heat sink can reach up to 2677 kW·m$^{-2}$ with the wall superheat at 17.0° C., while the CCDM heat sink acquires 1993 kW·m$^{-2}$ only with a higher wall superheat at 20.5° C. No partial dry-out appears even in the CCDM heat sink in these two groups of tests due to larger working fluid mass fluxes, which may mitigate two-phase flow instability and, therefore, alleviate local hot spots during flow boiling process. The CFDM heat sink 100 of the present invention consistently demonstrates steady two-phase flow throughout all various test conditions.

Figure 10:
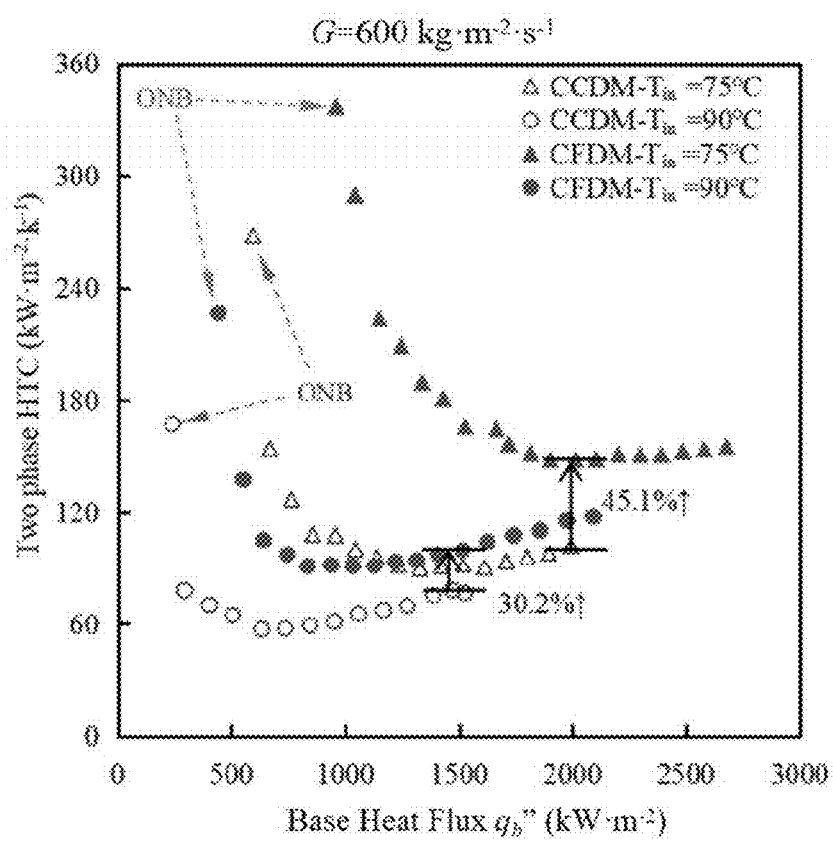
FIG. 10 depicts two-phase HTC vs. base heat flux.

Heat transfer coefficient: The two-phase heat transfer coefficient (HTC), which can be readily obtained from corresponding boiling curve, was determined for both designs. Notably, the highest wall temperature among three locations is employed for the calculation of heat transfer coefficients, which refers to the worst heat transfer coefficient as a uniform heat flux is imposed in order to provide conservative performance demonstration. Using G=600 kg·m$^{-2}$·s$^{-1}$ as an example, FIG. 10 illustrates and compares the two-phase HTC versus base heat flux for both the CCDM and CFDM heat sinks. For both designs, the point of ONB demonstrates the highest HTC and after ONB, for all cases, HTC decreases with the increase in heat flux. Flow visualization indicates that the highest HTC is associated with nucleation of tiny bubbles. HTC decreases when the flow pattern evolves to bubbly flow, and HTC may reach a nearly constant value or slightly increase with increasing heat flux, if the flow pattern evolves further into slug flow. In general, consistent with the boiling curve, the CFDM heat sink 100 of the present invention demonstrates higher HTCs than those of the CCDM for the inlet temperature of Tin=90° C. and Tin=75° C. For the same inlet temperature of Tin=90° C., the HTC of the CFDM heat sink 100 can reach 99.8 kW·m$^{-2}$·K$^{-1}$, which is a 30.2% increase compared to 76.7 kW·m$^{-2}$·K$^{-1}$ for the CCDM. When decreasing the inlet temperature to Tin=75° C., a more significant increment of 45.1% from 102.2 kW·m$^2$·K$^{-1}$ in the CCDM to 148.4 kW·m$^2$·K$^{-1}$ in the CFDM is demonstrated. In the CDFM heat sink 100, the large temperature difference between the downstream liquid-vapor mixture and neighboring upstream subcooled liquid can significantly enhance the heat exchange interaction through the copper wall between neighboring channels.

Figure 11C:
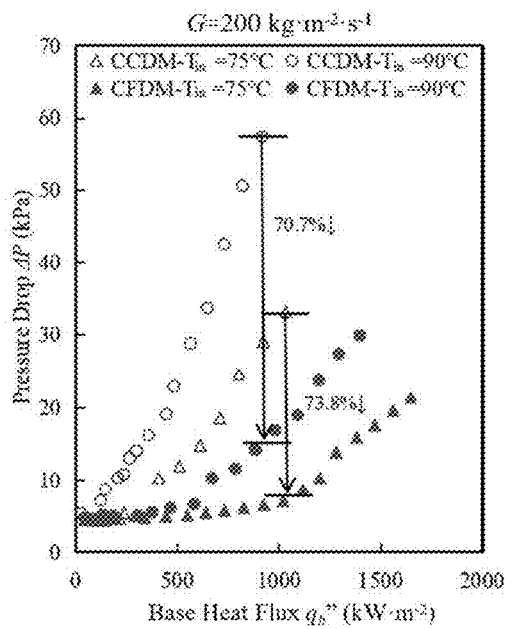

Pressure drop: The pressure drop, which has a direct effect on the pumping power consumption of circulating coolant, is another key issue for the design of a heat sink. FIG. 11A-C depicts the pressure drop of the CCDM and CFDM heat sinks for three different mass fluxes and two inlet temperatures. Generally, the pressure drop remains small and approximately the same for all the cases with the same mass flux in the single-phase regime for both the CCDM and CFDM heat sinks. After ONB, the pressure drop is significantly augmented due to the two-phase friction and possibly acceleration pressure drop in narrow diverging microchannels, though the CCDM heat sink exhibits significantly higher pressure drop than that for the CFDM heat sink. For example, FIG. 11A shows that for G=200 kg·m$^{-1}$s$^{-1}$, Tin=90° C., the pressure drop through the CCDM heat sink 100' corresponding to the maximum heat flux for this case is 57.39 kPa, while it is only 16.81 kPa in the CFDM heat sink 100 for the same heat flux. A significant pressure drop saving of 70.7% is acquired. An even more dramatic reduction in pressure drop of 73.8% occurs for T$_{in}$=75° C., which demonstrates significant heat transfer between neighboring channels through counter flow. The results are consistent with the aforementioned lateral heat transfer mechanism. The heat transferring from the two-phase mixture downstream to the upstream highly subcooled fluid flow in the neighboring channels in the CFDM heat sink significantly reduces the void fraction downstream and, therefore, significantly reduces the two-phase pressure drop. Such a merit of significant reduction in pressure drop also occurs for other cases with higher flow rates. FIG. 11B demonstrates that 61.8% and 54.4% reduction in pressure drop is obtained in the CFDM heat sink 100 of the present invention for G=400 kg·m$^{-2}$·s$^{-1}$ and Tin=75° C. and Tin=90° C., respectively. A further increase in mass flux to 600 kg·m$^2$·s$^1$, provides a pressure drop saving of 50.2% and 56.6%, respectively, for Tin=90° C. and Tin=75° C., as shown in FIG. 11C. Generally, the results demonstrate that all cases with a lower inlet temperature, i.e., Tin=75° C. demonstrate higher savings in pressure drop than that with higher inlet temperature, i.e., Tin=90° C. in the CFDM heat sink 100. This is because a lower inlet temperature enhances lateral heat transfer between neighboring channels and, therefore, more significant reduction in void fraction downstream and a greater reduction in pressure drop. The pressure drop saving demonstrates a decreasing trend with increase in mass flux. The corresponding two-phase flow patterns may explain such a trend. At G=200 kg·m$^{-2}$·s$^{-1}$, the CCDM heat sink 100' experiences a harsh two-phase heat exchange process with severe back flow and even partial dry-out for high heat fluxes resulting in a large pressure drop. In contrast, the counter flow design in CFDM heat sink 100 of the present invention eliminates back flow and the flow resistance is reduced significantly leading to a substantial pressure drop saving. An increase in mass flux may suppress back flow and prevent partial dry-out in the CCDM heat sink; therefore, the pressure drop will not dramatically rise to a large level and the pressure drop saving is reduced.

Coefficient of Performance

Table 2 shows the coefficient of performance (COP) for the CCDM heat sink 100' and the CFDM heat, sink 100 of the present invention.

TABLE 2

Coefficient of Performance

| Tin (°C) | | 75 | | | 90 | |
|---|---|---|---|---|---|---|
| G(kg·m$^{-2}$s$^{-1}$) | 200 | 400 | 600 | 200 | 400 | 600 |
| CCDM: COP | 9604 | 4319 | 2954 | 4870 | 2941 | 2401 |
| CFDM: COP | 18017 | 8623 | 6150 | 10865 | 5386 | 4499 |
| Increment | 87.6% | 99.6% | 108.2% | 123.1% | 83.2% | 87.4% |

Figure 11C:
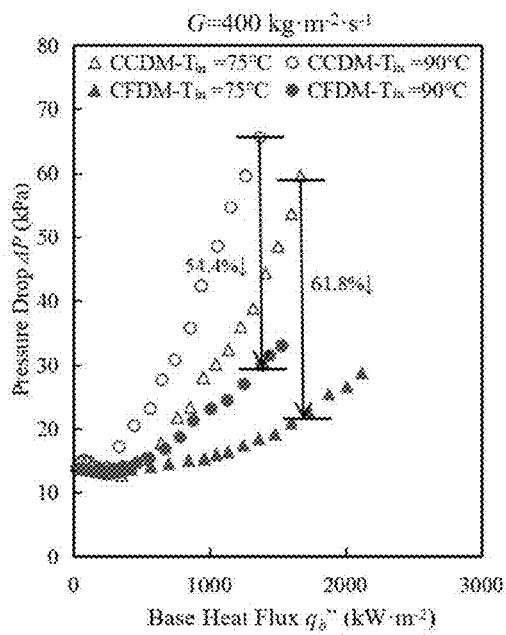
Figure 11C:
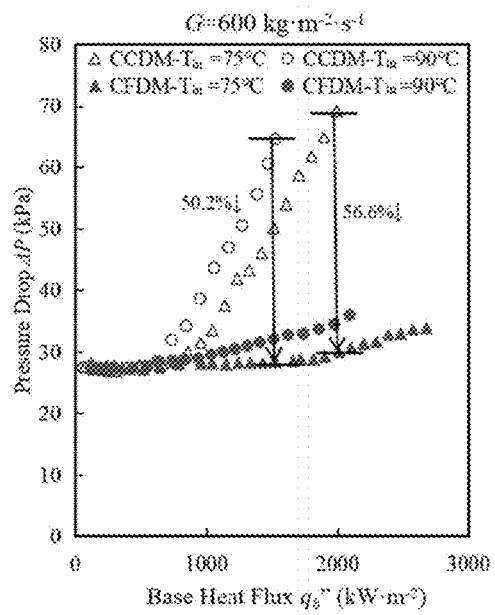

The coefficient of performance (COP) is defined as the ratio of heat dissipation rate to the pumping power consumed for the flow through the heat sink. Calculated by Eq. (9) and Eq. (10), Table 2 illustrates the COPs of the CCDM and CFDM heat sinks under their corresponding maximum base heat flux conditions subjected to a heat sink temperature limit of 140° C. in this study. As mass flux increases from 200 kg·m$^{-2}$·s$^{-1}$ to 600 kg·m$^{-2}$·s$^{-1}$, the COP of all tests exhibits a decreasing trend due to the quick rise of pumping power with the increase in the flow rate. The pumping power is a product of pressure drop and volume flow rate. The pressure drop itself is proportional to the mass flow rate with an exponent of 1 to 2, depending on the flow state, i.e., laminar, or turbulent flow. Consequently, the pumping power is proportional to the mass flow rate with an exponent of 2 to 3. The heat dissipation rate is generally proportional to the mass flow rate. Therefore, COP demonstrates a maximum at the lowest mass flow rate for a given inlet temperature. Compared with the heat dissipation rate, the large numerical value of COP shown in Table 2 indicates the pumping power is negligibly small for both designs. More importantly, the CFDM heat sink 100 of the present invention demonstrates significantly better COP than that of the CCDM heat sink 100' with an increment factor ranging from 83.2% to 123.1% through all the tests. The COP for CFDM heat sink ranges from 4499 to 18017, while it is from 2401 to 9604 for the CCDM. The inlet temperature shows significant effect on the enhancement. At a lower inlet temperature of 75° C., the highest increment appears for the highest flow rate, while it occurs for the lowest flow rate when the inlet temperature is increased to 90° C. Notably, the COP enhancement is a product of pumping power ratio of CCDM to CFDM and heat dissipation rate ratio of CFDM to CCDM for a given highest wall temperature allowable in the present study. Both ratios are significantly greater than 1, as demonstrated earlier in FIG. 9 for the heat dissipation ratio and FIG. 11 for the pumping power ratio. For the lower inlet temperature of 75° C., the heat dissipation rate in CFDM is much better than that in CCDM, as the channel-to-channel heat transfer is very high due to large flow rate and large temperature difference. Consequently, the high flow rate demonstrates the highest increment in COP. However, for the higher inlet temperature of 90° C., the highest increment takes place at the lowest flow rate. Flow visualization, as shown in FIG. 5, indicates severe back flow and partial dry-out in the CCDM heat sink 100'. This dramatically increases the two-phase pressure drop and, therefore, pumping energy consumption of the CCDM and leads to the higher pumping power ratio at the lowest flow rate. Thus, the advantage of the CFDM under this condition is further highlighted. Overall, lateral heat transfer between neighboring channels in the counter flow design brings excellent merit of the COP for heat dissipation with less pumping power in the CFDM heat sink.

The present invention provides a high performance heat sink with counter flow microchannels to fulfill the demand of high heat flux dissipation in power electronics. The proposed counter flow microchannels, which combine an optional diverging angle for bubble expansion with unique counter-flow liquid distribution, demonstrate the following: 1. In a two-phase region, the flow patterns of CCDM and CFDM heat sinks are quite different. The CFDM heat sinks of the present invention exhibit the advantage of a lateral wall cooling mechanism; further, the generated bubbles in the microchannels may expand, shrink, or even disappear in the low heat flux. For median and high heat fluxes, the flowing bubbles will expand and merge into slug flow in the downstream, and finally expel out smoothly. No back flow or hot spots are observed, which is inevitable in the CCDM heat sink 100' under very high heat flux and low mass flux. 2. Improvement of temperature uniformity is achieved in the CFDM tests. Under various mass fluxes and inlet temperatures, the CFDM performs smaller sink temperature maldistribution while maintaining a lower average sink temperature. This merit increases with inlet temperature reduction and mass flux increment. 3. Under the same mass flux and inlet temperature, all comparisons show that the heat transfer performance of the CFDM heat sink 100 of the present invention outperforms that of the CCDM heat sink 100'. The base heat flux under the same wall superheat is significantly enhanced, and the elevation of the HTCs reaches up to 45.1% under the condition of G=600 kg·m$^{-2}$s$^{-1}$ and Tin=75° C. 4. The CFDM heat sink provides a significant reduction of pressure drop compared to that of CCDM heat sink. The pressure drop saving of the CFDM under various conditions ranges from 50.2% to 73.8%. The achievements are consistent with the principle of the lateral wall cooling mechanism, as the bubbles can shrink under low heat flux, the slug may reduce its volume under median heat flux, and the churn flow can be maintained in a stable condition under high heat flux. 5. Significantly large enhancement in heat dissipation capacity and significantly lower pressure drop in the CFDM heat sink 100 of the present invention leads to COP figures from 4499 to 18017, with a remarkable enhancement ranging from 83.2% to 123.1%, compared with that of the CCDM heat sink 100'. This demonstrates the great merit of the counter flow design and excellent potential for real heat dissipation applications.

Various modifications can be made without departing from the scope of the invention, in particular the invention as defined by the claims. For example, the heat sink can have any number of two or more microchannels. The microchannels may be arranged in one or more layers, or they need not be strictly aligned. The shape, form, and/or size of each microchannel can be different than those illustrated. "Adjacent microchannels" refer to two microchannels right next to each other but with any separation.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A microchannel heat sink, comprising:
a plurality of approximately parallel microchannels, each microchannel including a working fluid inlet including an opening for receiving the working fluid and a working fluid outlet including an opening for discharging the working fluid away from the heat sink positioned at approximately opposite ends of the heat sink,
each working fluid inlet of a first microchannel being positioned adjacent to a working fluid outlet of a second, adjacent microchannel such that the plurality of approximately parallel microchannels have alternating working fluid flows in opposite directions for each adjacent pair of microchannels,
each microchannel is thermally coupled to an adjacent microchannel for heat exchange between the adjacent microchannels;
each microchannel being dimensioned and configured such that the working fluid entering the microchannel experiences two-phase flow of the working fluid including at least one vapor phase and at least one liquid phase, and wherein each microchannel working fluid inlet is at an angle to its corresponding working fluid outlet.

2. The microchannel heat sink of claim 1, wherein each microchannel working fluid inlet is at an angle of approximately 90 degrees with respect to its corresponding working fluid outlet.

3. The microchannel heat sink of claim 1, wherein each microchannel includes a pair of microchannel sidewalls.

4. The microchannel heat sink of claim 3, wherein the pair of microchannel sidewalls diverges at an angle of between zero and one degree.

5. The microchannel heat sink of claim 1, wherein the plurality of microchannels define parallel longitudinal axes that are arranged on the same plane.

6. The microchannel heat sink of claim 1, wherein each of the plurality of microchannels has a cross-sectional area that gradually increases between the microchannel working fluid inlet and the corresponding microchannel working fluid outlet.

7. The microchannel heat sink of claim 1, wherein each of the plurality of microchannels has a depth that gradually increases between the microchannel working fluid inlet and the corresponding microchannel working fluid outlet.

8. The microchannel heat sink of claim 1, wherein each of the plurality of microchannels has a width that gradually increases between the microchannel working fluid inlet and the corresponding microchannel working fluid outlet.

9. The microchannel heat sink of claim 1, wherein each of the plurality of microchannels has an approximately similar size and shape.

10. The microchannel heat sink of claim 1, wherein each microchannel includes a pair of microchannel walls arranged to separate corresponding adjacent microchannels such that each adjacent microchannel shares one common wall to enable thermal coupling between the corresponding adjacent microchannels.

11. The microchannel heat sink of claim 1, wherein the heat sink comprises one or more thermally conductive metals, alloys or composites.

12. The microchannel heat sink of claim 11, wherein the heat sink comprises one or more of aluminum, an aluminum alloy, copper, or a copper alloy.

13. The microchannel heat sink of claim 10, wherein the microchannel walls are connected to form a continuous wall in a boustrophedonic form.

14. The microchannel heat sink of claim 10, wherein each of the microchannel walls includes one or more surfaces that are roughened, include projections, or include recesses to provide bubble nucleation sites.

15. A thermal management system comprising:
one or more microchannel heat sinks of claim 1;
a working fluid storage container for storing working fluid; and
a fluid circulation system fluidly connected with the working fluid storage and the one or more microchannel heat sinks.

16. An electronic device or component positioned adjacent to a microchannel heat sink of claim 1.

* * * * *